US006667489B2

(12) United States Patent
Suzumura et al.

(10) Patent No.: US 6,667,489 B2
(45) Date of Patent: Dec. 23, 2003

(54) HETEROJUNCTION BIPOLAR TRANSISTOR AND METHOD FOR PRODUCTION THEREOF

(75) Inventors: Isao Suzumura, Kokubunji (JP); Katsuya Oda, Hachioji (JP); Katsuyoshi Washio, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/299,837

(22) Filed: Nov. 20, 2002

(65) Prior Publication Data

US 2003/0098465 A1 May 29, 2003

(30) Foreign Application Priority Data

Nov. 29, 2001 (JP) ........................ P2001-365037

(51) Int. Cl.[7] .................. H01L 29/06; H01L 31/0328; H01L 31/0336; H01L 31/072; H01L 31/109
(52) U.S. Cl. ................. 257/12; 257/19; 257/183; 257/197
(58) Field of Search .................. 257/12, 19, 197, 257/76–78, 183–201

(56) References Cited

U.S. PATENT DOCUMENTS

| | | | | |
|---|---|---|---|---|
| 5,523,592 A | * | 6/1996 | Nakagawa et al. | 257/96 |
| 5,963,817 A | * | 10/1999 | Chu et al. | 438/410 |
| 6,190,975 B1 | * | 2/2001 | Kubo et al. | 438/285 |
| 6,251,751 B1 | * | 6/2001 | Chu et al. | 438/439 |
| 6,403,976 B1 | * | 6/2002 | Saitoh et al. | 257/19 |
| 6,465,870 B2 | * | 10/2002 | Voldman | 257/565 |
| 2002/0020851 A1 | * | 2/2002 | Sakuma | 257/197 |
| 2003/0071281 A1 | * | 4/2003 | Lippert et al. | 257/200 |

FOREIGN PATENT DOCUMENTS

| | | |
|---|---|---|
| JP | 2569058 | 7/1987 |
| JP | 06-224127 | 1/1993 |
| JP | 2000-077425 | 9/1998 |
| JP | 2001-068479 | 6/2000 |

OTHER PUBLICATIONS

B. Heinemann, D. Knoll, R. Barth, D. Bolze, K. Blum, J. Drews, K.E. Ehwald, G.G. Fischer, K. Köpke, R. Krüger, R. Kurps, H, Rücker, P. Schley, W. Winkler and H. E. Wulf, "Cost–Effective High–Performance High–Voltage SiGe:C HBTs with 100 GHz $f_T$ and $BV_{CEO} \times f_T$ Products Exceeding 220VGHz", IEEE (2001) pp. 348–351.

J. Bock, H. Schafer, H. Knapp, D. Zoschg, K. Aufinger, M. Wurzer, S. Boguth, R, Stengl, R, Schreiter, T.F. Feister, "High Speed SiGe:C Bipolar Technology", IEEE (2001), pp. 344–347.

* cited by examiner

*Primary Examiner*—Amir Zarabian
*Assistant Examiner*—Monica Lewis

(57) ABSTRACT

A high-speed heterojunction bipolar transistor in a large injection of electrons from the emitter and a method for production thereof. In a typical example of the SiGeC heterojunction bipolar transistor, the collector has a layer of n-type single-crystal Si and a layer of n-type single-crystal SiGe, the base is a layer of heavily doped p-type single-crystal SiGeC, and the emitter is a layer of n-type single-crystal Si. At the heterointerface between the layer of n-type single-crystal SiGe and the layer of p-type single-crystal SiGeC, the bandgap of the p-type single-crystal SiGeC is larger than that of the layer of n-type single-crystal SiGe. Even though the effective neutral base expands due to an increase in electrons injected from the emitter, no energy barrier occurs in the conduction band at the heterointerface between the layer of n-type single-crystal SiGe and the layer of p-type single-crystal SiGeC. Thus, the diffusion of electrons is not inhibited and it is possible to realize high-speed heterojunction bipolar transistors even in the high injection state.

17 Claims, 25 Drawing Sheets

US 6,667,489 B2

HETEROJUNCTION BIPOLAR TRANSISTOR AND METHOD FOR PRODUCTION THEREOF

BACKGROUND OF THE INVENTION

1. Field of the Invention

The present invention relates to a semiconductor device having a heterojunction. The present invention is useful particularly for a bipolar transistor having an SiGeC layer formed by epitaxial growth.

2. Description of the Related Art

A heterojunction bipolar transistor (HBT) made up of single-crystal SiGeC and single-crystal Si is disclosed in JP-A No. 68479/2001. As FIG. 24 hereof shows in section, this HBT consists of a collector, a base, and an emitter. The collector comprises a layer 101 of n-type single-crystal Si and a layer 102 of n-type single-crystal SiGeC. The base is a layer 103 of p-type single-crystal SiGeC. The emitter comprises a layer 104 of n-type single-crystal SiGeC and a layer 105 of n-type single-crystal Si.

The conventional HBT has the profiles of compositional ratios of Ge and C and concentration of Boron (B) which are distributed as shown in FIG. 25 hereof. It is to be noted that the compositional ratios of Ge and C increase in the collector in going from layer 101 (layer of n-type single-crystal Si) to layer 102 (layer of n-type single-crystal SiGeC), gradually decrease in the base in going from layer 102 to layer 104, and further decreases in the emitter in going from layer 104 (layer of n-type single-crystal SiGeC) to layer 105 (layer of n-type single-crystal Si).

The HBT constructed as shown in FIG. 25 has an energy band gap structure (the lower end of the conduction band and the upper end of the valence band) as shown in FIG. 26. FIG. 26A shows the band structure for a small injection of electrons from the emitter, and FIG. 26B shows the band structure for a large injection of electrons from the emitter. It is to be noted that the energy of the conduction band in the base 103 (layer of p-type single-crystal SiGeC) decreases in going from the emitter to the collector according as the compositional ratios of Ge and C change.

In the conduction band, there is no energy barrier due to band gap at the interface between layer 101 (layer of n-type single-crystal Si) and layer 102 (layer of n-type single-crystal SiGeC layer) forming the collector. Consequently, electrons that are injected from the emitter travel through the base with an acceleration due to an electric field created by the inclined conduction band. See FIG. 26A.

An example of HBT having a heterojunction of single-crystal SiGe and single-crystal SiC is disclosed in JP-A No. 77425/2000. As FIG. 27 shows in section, this HBT is constructed of a collector (consisting of a layer 106 of n-type single-crystal Si and a layer 107 of n-type single-crystal SiC), a base (which is a layer 108 of p-type single-crystal SiGe), and an emitter (consisting of a layer 109 of n-type single-crystal SiC and a layer 110 of n-type single-crystal Si).

SUMMARY OF THE INVENTION

It would be desirable to have an HBT which has a heterojunction between a layer of single-crystal Si, a layer of single-crystal SiGe, and a layer of single-crystal SiGeC, capable of high-speed operation even with a large injection of electrons from the emitter.

The present invention is intended to address the following problems encountered in the conventional technologies.

In the conventional bipolar transistor having the base formed from single-crystal SiGeC, the collector consists of a layer 101 of single-crystal Si and a layer 102 (FIG. 24) of n-type single-crystal SiGeC placed directly thereon which has a smaller bandgap than single-crystal Si. This structure induces the following phenomenon. As electrons injected from the emitter increase, electrons from the base diffuse into the depletion layer adjacent to the collector at the base-collector junction, thereby canceling out space charges due to n-type impurity ions. This substantially expands the neutral base. The consequence is that an energy barrier appears in the conduction band at the depletion layer of the base-collector junction. This energy barrier impedes the diffusion of electrons injected from the emitter, which in turn deteriorates the HBT's high-speed performance. FIG. 26 is an example of the energy bandgap of the HBT constructed as shown in FIG. 24. FIG. 26A is a band structure for a small injection of electrons from the emitter, and FIG. 26B is a band structure for a large injection of electrons from the emitter. It is clearly understood that the neutral base expands as the injection of electrons from the emitter increases.

One possible way to prevent the operating speed of HBT from being decreased by the energy barrier despite a large injection of electrons from the emitter is to make thicker the layer 102 (FIG. 24) of n-type single-crystal SiGeC. However, this is not practical because improving the crystallinity requires decreasing the growth temperature. Since the growth rate of the SiGeC layer exponentially decreases in inverse proportion to the growth temperature, a thick layer of single-crystal SiGeC takes a very long time to grow. This leads to a low throughput and a high cost in the manufacture of SiGeC HBT.

Another example of the conventional HBT is shown in FIG. 27. It has a base layer 108 of single-crystal SiGe and a layer 106 in the collector of single-crystal Si, with a layer 107 of n-type single-crystal SiC interposed between them. In this HBT, the collector has a larger bandgap than the base regardless of the injection of electrons from the emitter. This creates an energy barrier in the conduction band at the base-collector junction. This in turn poses a problem of impeding the diffusion of electrons. As a result, high-speed performance deteriorates.

The essential features of the present invention are summarized below with reference to FIGS. 1 and 6. FIG. 1 is a sectional view showing the laminate construction of the main region of the HBT of the present invention. FIG. 6A is a schematic diagram showing the energy band structure of a preferred HBT of the present invention in the normal operating state. FIG. 6B is a schematic diagram showing the energy band structure of a preferred HBT of the present invention which manifests itself when the neutral base extends to the collector. These figures show the lower end of the conduction band and the upper end of the valence band. The references of numerals are as follows: 16: emitter, 9: base, 7 and 3: collector (3 denoting the region of the semiconductor substrate)

The present invention provides an HBT having the base and collector layers such that no energy barrier appears in the conduction band at the depletion layer of the base-collector junction. In addition, no energy step occurs in the HBT of the present invention in the neutral base when the injection of electrons from the emitter is large.

The HBT of the present invention is achieved by forming the base and collector from single-crystal SiGe as the main material for the HBT in which single-crystal SiGeC exists at the heterojunction. Basically, the selection of the material is made such that the energy gap (Eg) of the base is larger than the Eg of the collector when the injection of electrons from the emitter is large. The above-mentioned single-crystal SiGeC may be used for the base and collector regions. Single-crystal SiGeC is preferably selected for the base or collector.

In the HBT of the present invention, the base preferably comprises a layer of single-crystal SiGe or single-crystal SiGeC, and the collector preferably comprises an SiGe layer or an SiGeC layer or a laminate of SiGeC layer and SiGe layer (which will be denoted by SiGeC/SiGe). The following table summarizes the preferred selections of the materials.

|   | Base  |      | Collector |            |
|---|-------|------|-----------|------------|
| 1 | SiGe  | —    | SiGeC     | SiGeC/SiGe |
| 2 | SiGeC | SiGe | SiGeC     | SiGeC/SiGe |

The emitter preferably comprises a single-crystal Si layer, a single-crystal SiGe layer, a laminate of single-crystal SiC layer and single-crystal SiGe layer (denoted by SiGe/SiC hereinafter), or a laminate of single-crystal SiGeC layer and single-crystal SiGe layer (denoted by SiGe/SiGeC hereinafter).

The present invention may be variously modified as follows within the scope thereof, although it complies with the conventional HBT technology for the thickness of each region.

The advantage of making the base from single-crystal SiGe is high-speed operation and improved current gain. Another advantage is the impossibility of degradation of crystallinity on account of impurities such as B which would be introduced along with C if the base were made from SiGeC.

However, when the base made from single-crystal SiGe is heavily doped with B (as an impurity), the base width expands as it diffuses into other regions. To remedy this drawback, it is desirable to make the collector from a layer of single-crystal SiGeC. C not only prevents the diffusion of B but also reduces the strain of the SiGeC layer because it has a smaller lattice constant than Si and Ge. The resultant collector is less likely to generate dislocations and defects resulting from a high-temperature annealing in the fabrication process of HBTs. This in turn suppresses leakage current. The advantage of making the collector from SiGeC or SiGeC/SiGe is that no energy barrier is formed in the depletion layer (adjacent to the collector) at the base-collector junction. This contributes to high-speed operation and to an improved current gain.

The advantage of introducing C into the base or making the base from single-crystal SiGeC is the prevention of diffusion of B (or an impurity introduced into the base). The suppression of impurity diffusion prevents the base width from expanding. This effect is particularly remarkable when the collector is made from SiGeC/SiGe. The result is that no energy barrier occurs in the conduction band at the depletion layer of the base-collector junction. This in turn leads to high-speed operation even though the injection of electrons from the emitter is large. In addition, the advantage of making the base from SiGeC and the collector from SiGeC/SiGe is the reduced strain in the SiGeC layer. The resultant base is less likely to generate dislocations and defects during annealing. This helps increase yields and reduce fluctuation in characteristic properties of HBTs. The C-free region in the collector permits a SiGe layer to selectively grow as the lower region of the collector in the semiconductor substrate. This structure is favorable to the production of HBTs.

The present invention can provide an HBT capable of high-speed operation even in the case where the injection of electrons from the emitter is large in an HBT which utilizes a heterojunction which is formed by using a single-crystal Si layer, a single-crystal SiGe layer, and a single-crystal SiGeC layer.

Moreover, according to another aspect of the present invention, it is possible to provide an HBT having a low production cost and a method for production thereof.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 24 is a sectional view showing the main regions of a conventional HBT.

FIG. 25 is a diagram showing the profile of compositional ratio of Ge and C and concentration of impurity in the conventional HBT.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided herein below with reference to the attached drawings.

At least eight preferred embodiments of the present invention are described below prior to the description of individual working examples.

(1) HBT having a layer of SiGeC as the base and a layer of SiGe as part of the collector.

Figure 1:
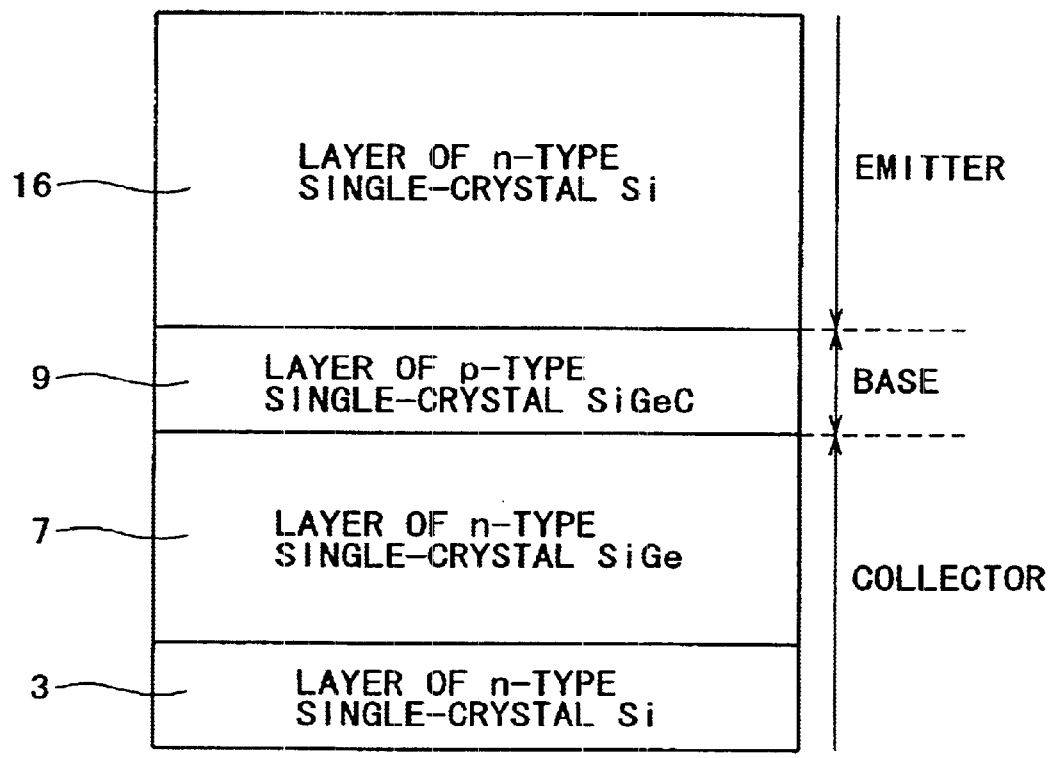
FIG. 1 is a sectional view showing the main regions of the HBT of a first preferred embodiment of the present invention.

A first preferred embodiment of the present invention is an HBT which is constructed as shown in FIG. 1. In this HBT, the collector comprises a layer 3 of n-type single-crystal Si and a layer 7 of n-type single-crystal SiGe (or a layer of single-crystal SiGe of the first conductivity type) placed thereon. The base comprises a layer 9 of p-type single-crystal SiGeC (or a layer of single-crystal SiGeC of the second conductivity type which is opposite to said first conductivity type) which is placed on the layer 7 of p-type single-crystal SiGeC. The emitter comprises a layer 16 of n-type single-crystal Si (or a layer of single-crystal Si of another first conductivity type) which is placed on the layer 9 of p-type single-crystal SiGeC. In the HBT of this construction, the bandgap in the layer 7 of n-type single-crystal SiGe (adjacent to the layer 9 of p-type single-crystal SiGeC) is approximately equal to or smaller than the bandgap in the layer 9 of p-type single-crystal SiGeC (adjacent to the layer 7 of n-type single-crystal SiGe).

(2) HBT having a layer of SiGeC as the base and a laminate of SiGeC/SiGe as part of the collector.

Figure 10:
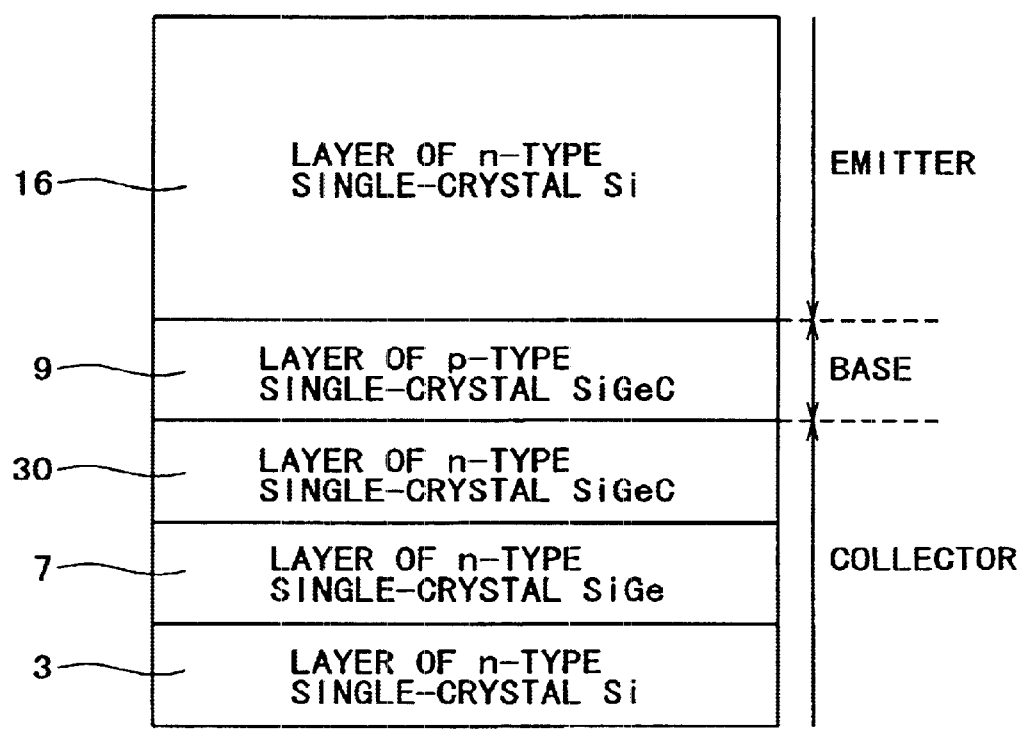
FIG. 10 is a sectional view showing the main regions of the HBT in a third preferred embodiment of the present invention.

A second preferred embodiment of the present invention is an HBT which is constructed as shown in FIG. 10. This HBT differs from that of the first preferred embodiment described above in that an additional layer 30 of n-type single-crystal SiGeC (or a layer of single-crystal SiGeC of the first conductivity type) as a part of the collector is placed between the layer 7 of n-type single-crystal SiGe of the first conductivity type and the layer 9 of p-type single-crystal SiGeC of the second conductivity type. In this construction, the bandgap in the layer 30 of n-type single-crystal SiGeC (adjacent to the layer 7 of n-type single-crystal SiGe) is approximately equal to or larger than the bandgap in the layer 7 of n-type single-crystal SiGe (adjacent to the layer 30 of n-type single-crystal SiGeC), and the bandgap in the layer 30 of n-type single-crystal SiGeC (adjacent to the layer 9 of p-type single-crystal SiGeC) is approximately equal to or smaller than the bandgap in the layer 9 of n-type single-crystal SiGeC (adjacent to the layer 30 of n-type single-crystal SiGeC).

(3) HBT having a layer of SiGe as the base and a layer of SiGeC as part of the collector.

Figure 11:
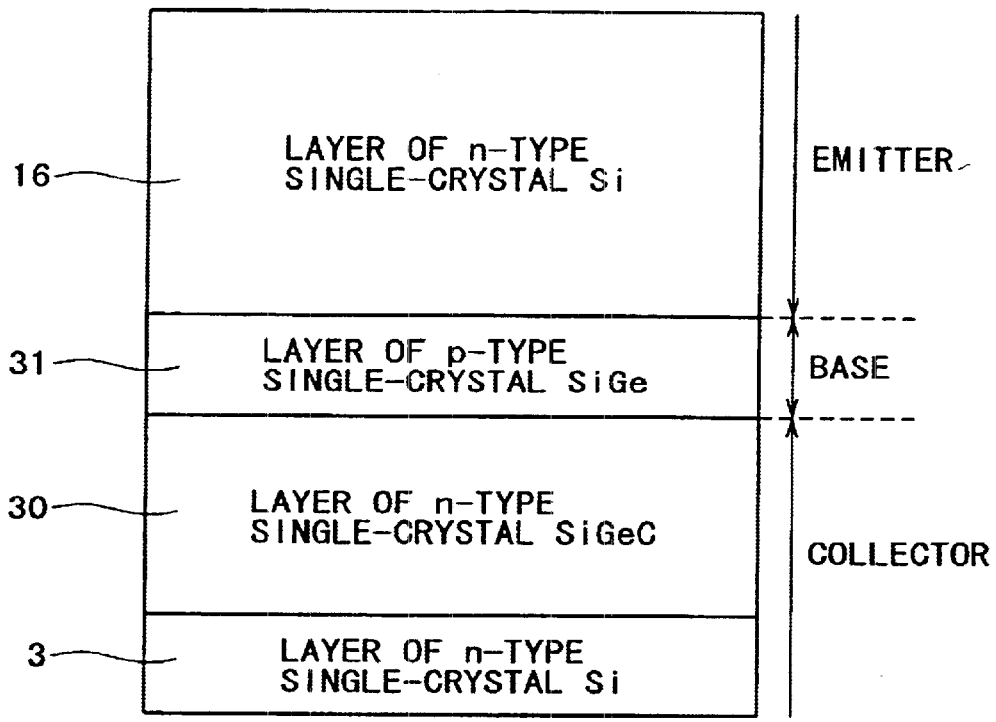
FIG. 11 is a sectional view showing the main regions of the HBT in a fourth preferred embodiment of the present invention.

A third preferred embodiment of the present invention is an HBT which is constructed as shown in FIG. 11. In this HBT, the collector comprises a layer 3 of n-type single-crystal Si (or a layer of single-crystal Si of the first conductivity type) and a layer 30 of n-type single-crystal SiGeC (or a layer of single-crystal SiGeC of the first conductivity type) placed thereon. The base is a layer 31 of p-type single-crystal SiGe (or a layer of single-crystal SiGe of the second conductivity type which is opposite to said first conductivity type) which is placed on said layer 30 of the first conductivity type. The emitter comprises a layer 16 of n-type single-crystal Si (or a layer of single-crystal Si of another first conductivity type) which is placed on the layer 31 of single-crystal SiGe of the second conductivity type. In this construction, the bandgap in the layer 30 of n-type single-crystal SiGeC (adjacent to the layer 31 of p-type single-crystal SiGe) is approximately equal to or smaller than the bandgap in the layer 31 of p-type single-crystal SiGe (adjacent to the layer 30 of n-type single-crystal SiGeC).

(4) HBT having a layer of SiGe as the base and a laminate of SiGeC/SiGe as part of the collector.

Figure 12:
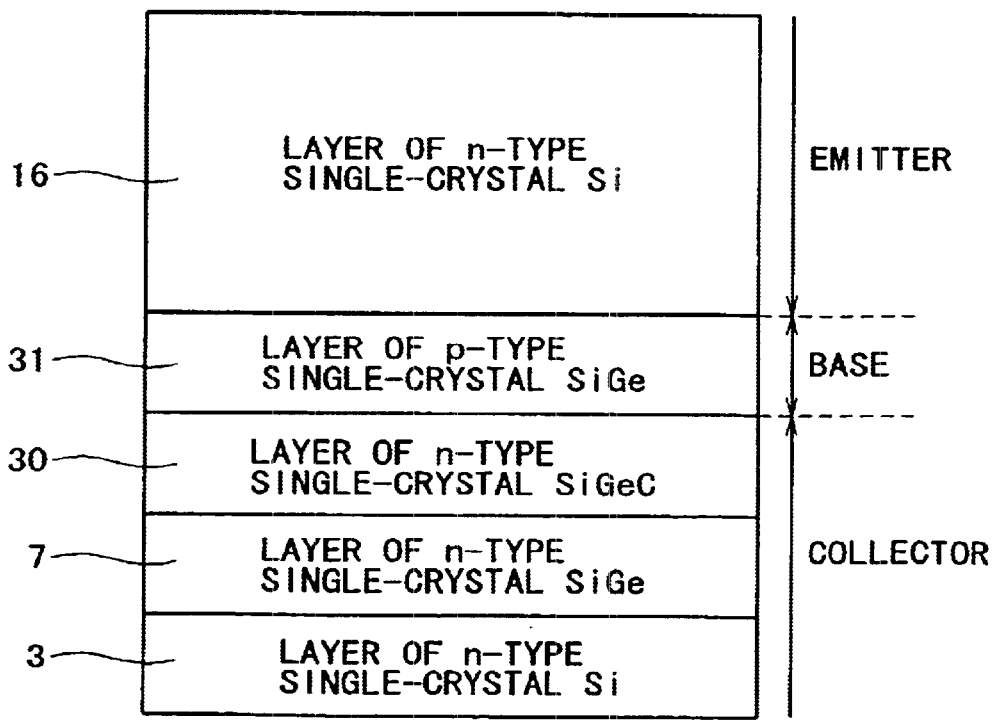
FIG. 12 is a sectional view showing the main regions of the HBT in a fifth preferred embodiment of the present invention.

A fourth preferred embodiment of the present invention is an HBT which is constructed as shown in FIG. 12. This HBT has an additional layer 7 of n-type single-crystal SiGe (or a layer of single-crystal SiGe of the first conductivity type) as a part of the collector between a layer 3 of n-type single-crystal Si (or a layer of single-crystal Si of the first conductivity type) and a layer 30 of n-Type single-crystal SiGeC (or a layer of single-crystal SiGeC of the first conductivity type). In this construction, the bandgap in the layer 7 of n-type single-crystal SiGe (adjacent to the layer 30 of n-type single-crystal SiGeC) is approximately equal to or smaller than the bandgap in the layer 30 of n-type single-crystal SiGeC (adjacent to the layer 7 of n-type single-crystal SiGe).

The following preferred embodiments (5) to (8) of the present invention differ from the foregoing ones in that the emitter is modified.

(5) HBT having a layer of SiGe or SiGeC as the base, a laminate of SiGeC/SiGe as part of the collector, and a layer of SiGe in the emitter.

Figure 13:
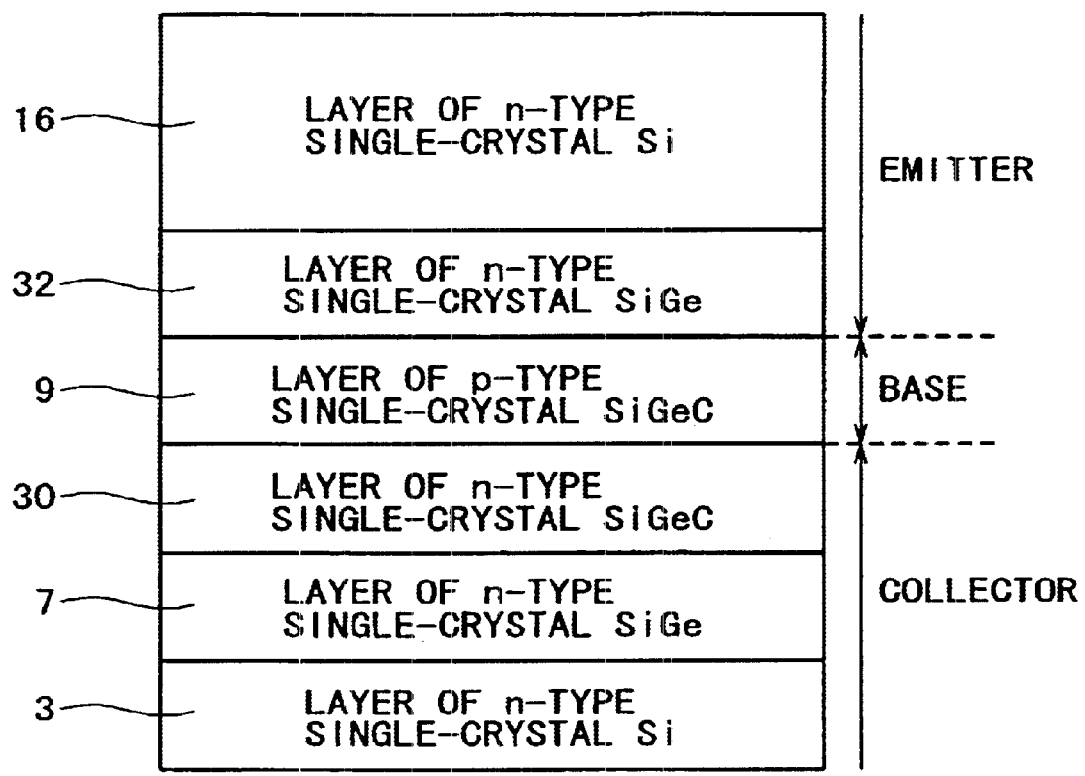
FIG. 13 is a sectional view showing the main regions of the HBT in a sixth preferred embodiment of the present invention.

As shown in FIG. 13, this HBT has an additional layer 32 of n-type single-crystal SiGe (or a layer of single-crystal SiGe of another first conductivity type) as a part of the emitter between a layer 9 of p-type single-crystal SiGeC of the second conductivity type and a layer 16 of n-type single-crystal Si of another first conductivity type (or a layer of single-crystal Si of another first conductivity type).

In the HBT of FIG. 13, the bandgap in the layer 32 of n-type single-crystal SiGe (or the layer of single-crystal SiGe of another first conductivity type, adjacent to the layer (base) of single-crystal of the second conductivity type) is approximately equal to or larger than the bandgap in the layer of single-crystal of the second conductivity type adjacent to the layer 32 of n-type single-crystal SiGe of another first conductivity type. Incidentally, the layer of single-crystal of the second conductivity type (or the base) is the layer 9 of p-type single-crystal SiGeC or the layer 31 of p-type single-crystal SiGe.

(6) HBT having a layer of SiGe or SiGeC as the base, a laminate of SiGeC/SiGe as part of the collector, and a laminate of Si/SiC as the emitter.

Figure 15:
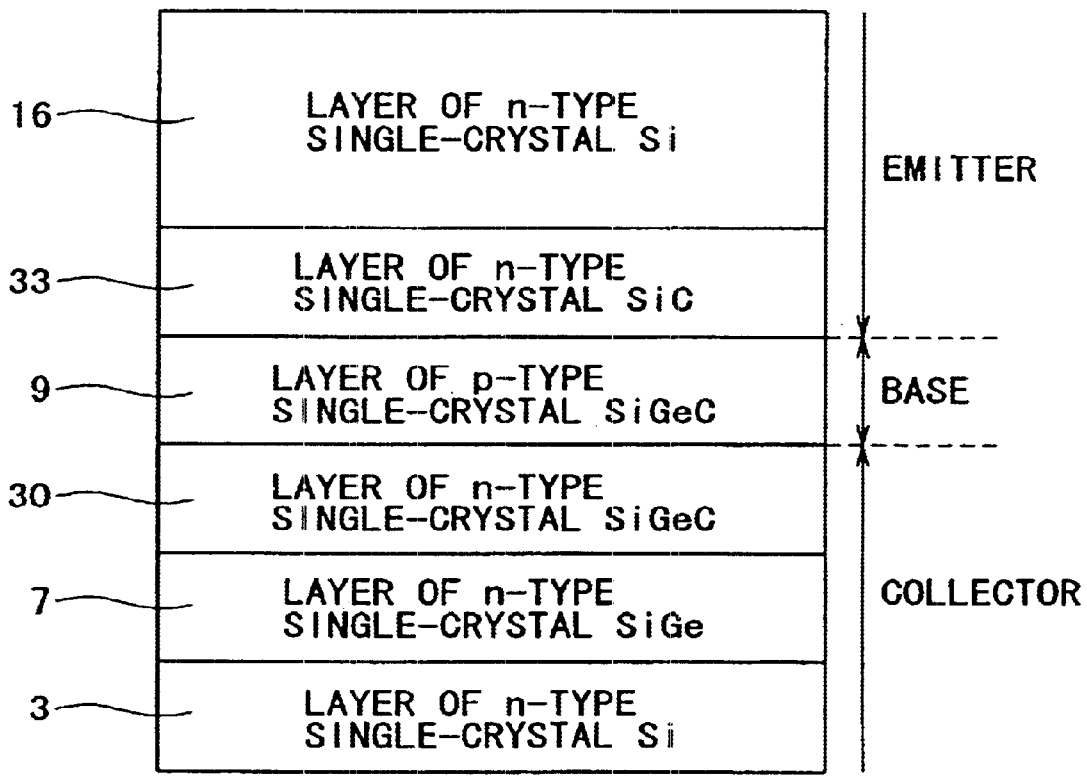
FIG. 15 is a sectional view showing the main regions of the HBT in a seventh preferred embodiment of the present invention.

As shown in FIG. 15, this HBT has an additional layer 33 of n-type single-crystal SiC (or a layer of single-crystal SiC of another first conductivity type) as a part of the emitter between the base 9 (which is a layer of p-type single-crystal SiGeC of the second conductivity type or alternatively a layer of p-type single-crystal SiGe of the second conductivity type) and a layer 16 of n-type single-crystal Si (or a layer of single-crystal Si of another first conductivity type) as the emitter.

In the HBT of FIG. 15, the bandgap in the layer 33 of n-type single-crystal SiC of the first conductivity type (adjacent to the base layer 9 of p-type single-crystal SiGeC or SiGe of the second conductivity type) is approximately equal to or larger than the bandgap in the layer 9 of p-type single-crystal SiGeC or SiGe of the second conductivity type (adjacent to the layer 33 of n-type single-crystal SiC of the first conductivity type).

(7) HBT having a layer of SiGe or SiGeC as the base, a laminate of SiGeC/SiGe as part of the collector, and a laminate of Si/SiGeC as the emitter.

Figure 17:
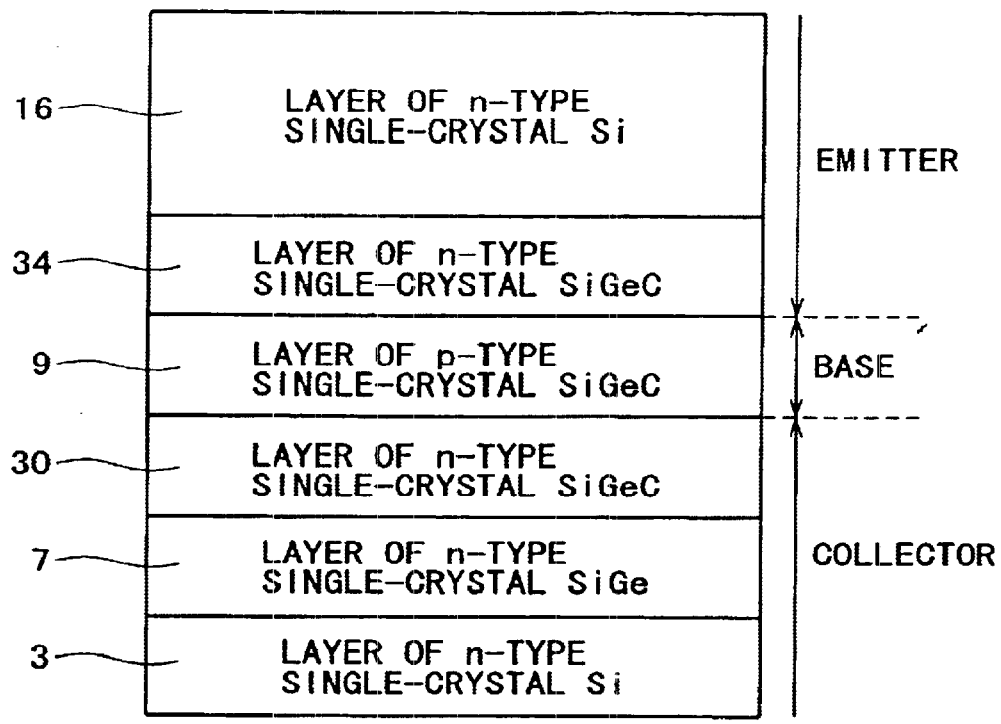
FIG. 17 is a sectional view showing the main regions of the HBT in an eighth preferred embodiment of the present invention.

The HBT shown in FIG. 17 has an additional layer 34 of n-type single-crystal SiGeC (or a layer of single-crystal SiGeC of another first conductivity type) as a part of the emitter between a layer 9 of p-type single-crystal SiGeC or SiGe of the second conductivity type and a layer 16 of n-type single-crystal Si (or a layer of single-crystal Si of another first conductivity type) as part of the emitter.

In the HBT of FIG. 17, the bandgap in the layer 34 of n-type single-crystal SiGeC of another first conductivity type (adjacent to the layer 9 of p-type single-crystal SiGeC or SiGe of the second conductivity type) is approximately equal to or larger than the bandgap in the base layer 9 of p-type single-crystal SiGeC or SiGe of the second conductivity type (adjacent to the layer 34 of n-type single-crystal SiGeC of another first conductivity type of the emitter).

(8) HBT having a layer of SiGe or SiGeC as the base, a layer of SiGeC/SiGe as the collector, and a layer of Si/SiC/SiGeC as the emitter.

Figure 18:
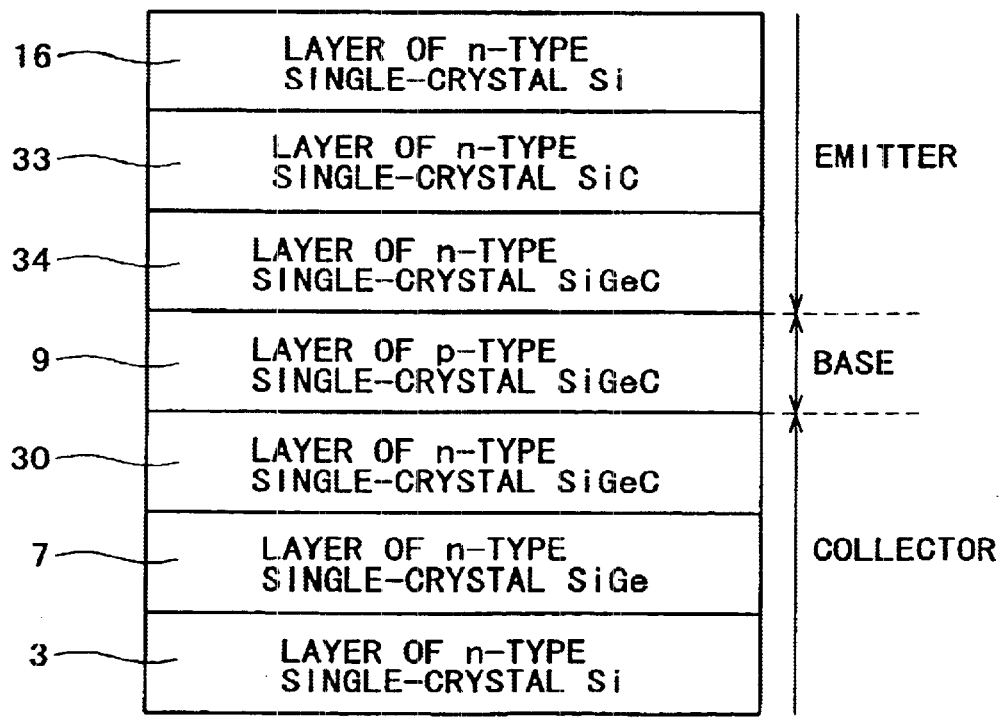
FIG. 18 is a sectional view showing the main regions of the HBT in a ninth preferred embodiment of the present invention.

This HBT shown in FIG. 18 has an additional layer 34 of n-type single-crystal SiGeC (or a layer of single-crystal SiGeC of another first conductivity type) as a part of the emitter, which is placed between a layer 9 of p-type single-crystal SiGeC (or a layer of single-crystal of the second conductivity type) or a layer 31 of p-type single-crystal SiGe and a layer 16 of n-type single-crystal Si (or a layer of single-crystal Si of another first conductivity type) and on a layer 9 of p-type single-crystal SiGeC or a layer 31 of p-type single-crystal SiGe. The HBT has a further additional layer 33 of n-type single-crystal SiC (or a layer of single-crystal SiC of the first conductivity type) on the layer 34 of n-type single-crystal SiGeC in the emitter.

In this HBT shown in FIG. 18, the bandgap in the layer 34 of n-type single-crystal SiGeC (or the layer of single-crystal SiGeC of another first conductivity type) adjacent to the layer 9 of p-type single-crystal SiGeC (or the layer of single-crystal of the second conductivity type) is approximately equal to or larger than the bandgap in the layer 9 of p-type single-crystal SiGeC or SiGe adjacent to the layer 34 of n-type single-crystal SiGeC.

In addition, the bandgap in the layer 33 of n-type single-crystal SiC (or the layer of single-crystal SiC of another first conductivity type) adjacent to the layer 34 of n-type single-crystal SiGeC (or the layer of single-crystal of another first conductivity type) is approximately equal to or larger than the bandgap in the layer 34 of n-type single-crystal SiGeC (or the layer of single-crystal SiGeC of another first conductivity type) adjacent to the layer 33 of n-type single-crystal SiC (or the layer of single-crystal SiC of another first conductivity type).

The above-mentioned HBTs preferably have a region (in at least part of the base and collector) in which the compositional ratio of Ge increases in going from the emitter to the collector.

In addition, it is desirable to form a region in which the compositional ratio of Ge increases in going from the emitter to the collector, in at least part of the layer of single-crystal SiGe of another first conductivity type (or the layer 32 of n-type single-crystal SiGe of the emitter shown in FIG. 13).

It is also desirable to form a region in which the compositional ratio of Ge increases in going from the emitter to the collector, in at least part of the layer of single-crystal SiGeC of another first conductivity type (or the layer 34 of n-type single-crystal SiGeC of the emitter shown in FIG. 17 or FIG. 18).

In addition, the above-mentioned HBTs preferably have a region (in at least part of the collector) in which the compositional ratio of Ge decreases in going from the emitter to the collector.

The above-mentioned HBTs preferably have a region, in at least part of the emitter, in which the compositional ratio of C increases in going from the emitter to the collector.

Additionally, the above-mentioned HBTs (having a C-containing layer in at least part of the base and collector) preferably have a region, in at least part of the base and collector, in which the compositional ratio of C decreases in going from the emitter to the collector.

Further, the above-mentioned HBTs are preferably constructed such that the layer of single-crystal containing both Ge and C has the compositional ratio of Ge to C ranging from 5 to 20.

Figure 7:
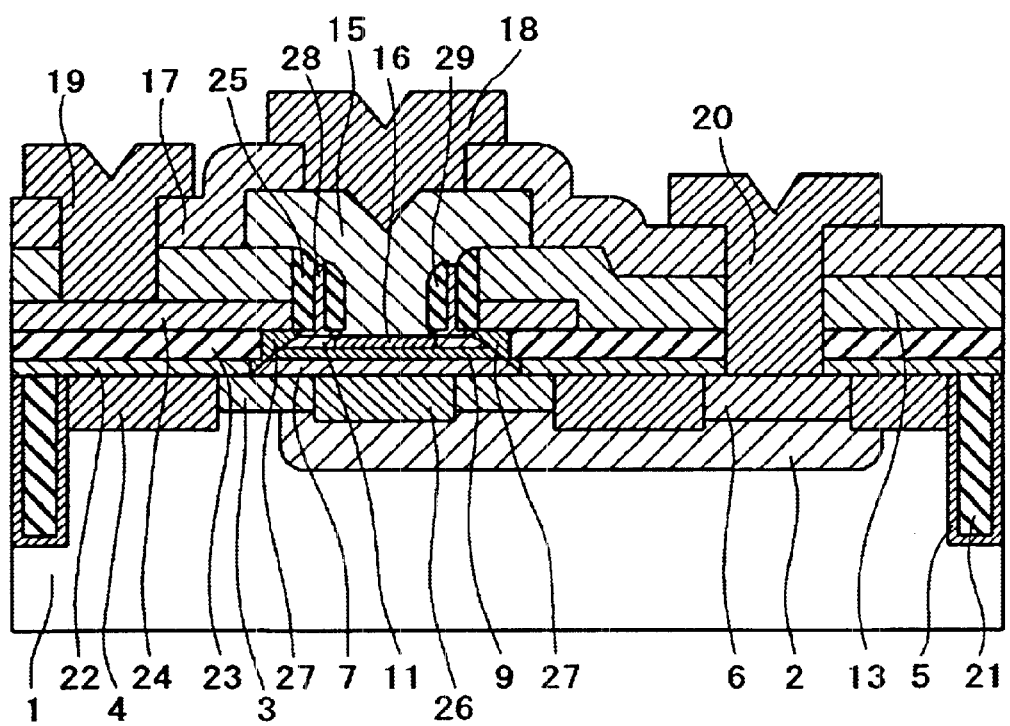
FIG. 7 is a sectional view showing the HBT pertaining to a second preferred embodiment of the present invention, in which the main regions are formed by selective epitaxial growth.

Moreover, as shown in FIG. 7, the HBT preferably comprises a substrate of single-crystal or a layer 1 of n-type single-crystal Si, an isolation film or a collector-base isolation film 22 formed thereon having an opening, a layer of single-crystal SiGe of the first conductivity type or a layer 7 of n-type single-crystal SiGe formed in the opening of said isolation film (which becomes the collector), a layer of single-crystal SiGeC of the second conductivity type or a layer 9 of p-type single-crystal SiGeC formed on said layer of single-crystal SiGe of the first conductivity type, and a layer of single-crystal Si of another first conductivity type or a layer 16 of n-type single-crystal Si formed on said layer of single-crystal SiGeC of the second conductivity type.

In this case, the HBT is preferably produced by a step of forming an isolation film or a collector-base isolation film on a substrate of single-crystal or a layer of n-type single-crystal Si, a step of making an opening in said isolation film, a step of forming in said opening by selective epitaxial growth a layer of single-crystal SiGe of the first conductivity type or a layer of n-type single-crystal SiGe (which becomes the collector), and a step of forming by selective epitaxial growth a layer of single-crystal SiGeC of the second conductivity type or a layer of p-type single-crystal SiGeC only in said opening on said layer of single-crystal SiGe of the first conductivity type.

Alternatively, the HBT preferably comprises a substrate of single-crystal or a layer of n-type single-crystal Si, an isolation film or a collector-base isolation film formed thereon having an opening, a layer of single-crystal SiGeC of the first conductivity type or a layer of n-type single-crystal SiGeC formed in the opening of said isolation film (which becomes the collector), a layer of single-crystal SiGe of the second conductivity type or a layer of p-type single-crystal SiGe formed on said layer of single-crystal SiGeC of the first conductivity type, and a layer of single-crystal Si of another first conductivity type or a layer of n-type single-crystal Si formed on said layer of single-crystal SiGe of the second conductivity type.

In this case, the HBT is preferably produced by a step of forming an isolation film or a collector-base isolation film on a substrate of single-crystal or a layer of n-type single-crystal Si, a step of making an opening in said isolation film, a step of forming in said opening by selective epitaxial growth a layer of single-crystal SiGeC of the first conductivity type or a layer of n-type single-crystal SiGeC (which becomes the collector), and a step of forming by selective epitaxial growth a layer of single-crystal SiGe of the second conductivity type or a layer of p-type single-crystal SiGe only in said opening on said layer of single-crystal SiGeC of the first conductivity type.

In what follows, the present invention will be described with reference to preferred examples thereof.

As shown in FIG. 1, the HBT according to a preferred embodiment of the present invention is constructed such that the collector comprises a layer 3 of n-type single-crystal Si and a layer 7 of n-type single-crystal SiGe. The base is preferably a layer 9 of heavily doped p-type single-crystal SiGeC, and the emitter is a layer 16 of n-type single-crystal Si.

As shown in FIG. 11, the HBT according to another preferred embodiment of the present invention is constructed such that the collector comprises a layer 3 of n-type single-crystal Si and a layer 30 of n-type single-crystal SiGeC, the base is a layer 31 of heavily doped p-type single-crystal SiGe, and the emitter is a layer 16 of n-type single-crystal Si. This structure prevents any energy barrier from appearing in the conduction band at the depletion layer of the base-collector junction regardless of the collector current. This feature permits the HBT to operate at a high speed because electrons injected from the emitter can diffuse without being blocked by the barrier.

In addition, the above-mentioned structure does not need a thick layer single-crystal SiGeC (which is slow to grow), and this contributes to efficient production with improved throughput and reduced production cost.

EXAMPLE 1

FIG. 1 is a sectional view showing the main regions of an HBT according to a preferred embodiment of the present invention. This HBT consists of a layer 3 of n-type single-crystal Si (as a part of the collector), a layer 7 of n-type single-crystal SiGe (as a part of the collector), a layer 9 of heavily doped p-type single-crystal SiGeC (as a base), and a layer 16 of n-type single-crystal Si (as an emitter), which are placed on top of each other.

Figure 2:
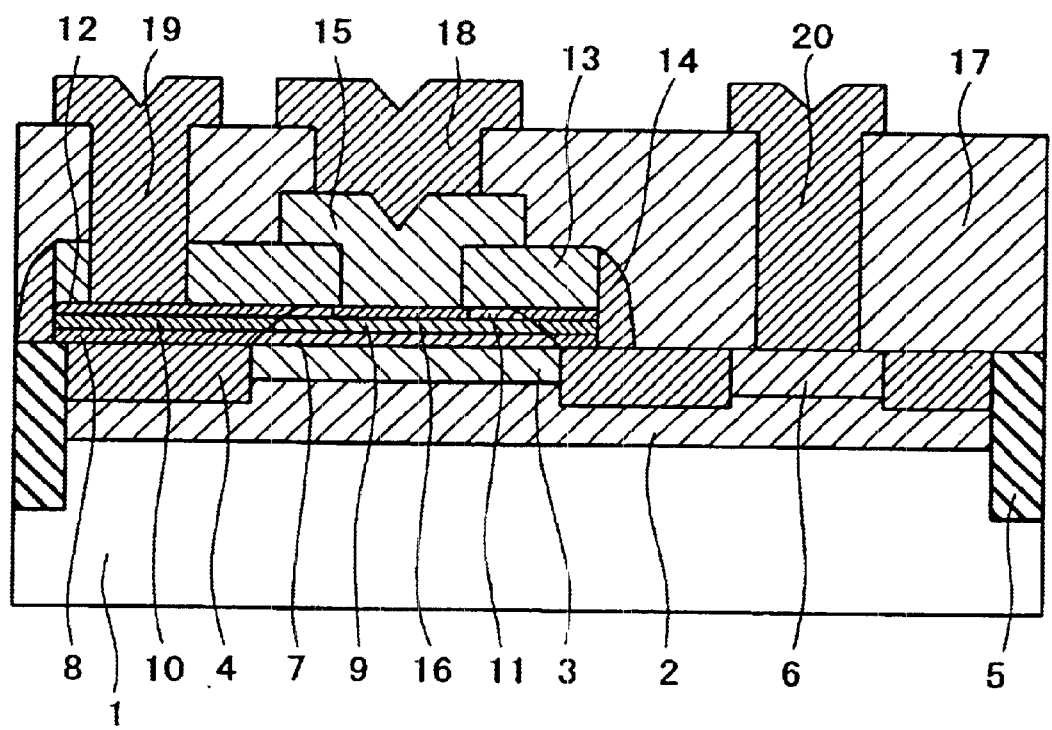
FIG. 2 is a longitudinal sectional view showing the HBT having the main regions as shown in FIG. 1.

The HBT has a sectional structure as shown in FIG. 2. It is manufactured in the following way. First, on an Si substrate 1 are formed sequentially a layer 2 of heavily doped n-type single-crystal Si and a layer 3 of n-type single-crystal Si (as a collector). Second, a collector-base isolation film 4 is formed on the part excluding the main region of the transistor and the part which the collector lead-out electrode is formed. Third, an isolation region is formed by means of an isolation film 5. Fourth, a collector lead-out electrode 6 is formed. On the entire surface of the substrate prepared as mentioned above are sequentially formed a layer of n-type SiGe, a layer of p-type SiGeC, and a layer of n-type Si. At this stage, the surface of the layer 3 of n-type single-crystal Si as the collector is exposed in the part where the isolation films 4 and 5 are not formed. Consequently, in this part are epitaxially grown a layer 7 of n-type single-crystal SiGe, a layer 9 of p-type single-crystal SiGeC, and a layer 11 of n-type single-crystal Si. At the same time, on the collector-base isolation film are grown a layer 8 of n-type polycrystalline SiGe, a layer 10 of p-type polycrystalline SiGeC, and a layer 12 of n-type polycrystalline Si.

Then, an emitter-base isolation film 13 is formed on the layer 11 of n-type single-crystal Si and the layer 12 of n-type polycrystalline Si, which have been formed as mentioned above. Then, the isolation film 13, the single-crystal layers 7, 9, and 11, and the polycrystalline layers 8, 10, and 12 are removed except for those in the vicinity of the main region. Then, an isolation film 14 is deposited and formed on the lateral wall of the single-crystal layers 7, 9, and 11 and the polycrystalline layers 8, 10, and 12. A layer 15 of heavily doped n-type polycrystalline Si (which becomes the emitter lead-out electrode) is formed. Annealing is performed so that the n-type impurity (e.g., P) in the layer 15 of n-type polycrystalline Si 15 diffuses into the layer 11 of n-type single-crystal Si, thereby forming the emitter region 16. Then, the isolation film 17 is deposited on the entire surface of the substrate and openings are made in the emitter, the base, and the collector. Then, the emitter electrode 18, the base electrode 19, and the collector electrode 20 are formed.

Figure 3A:
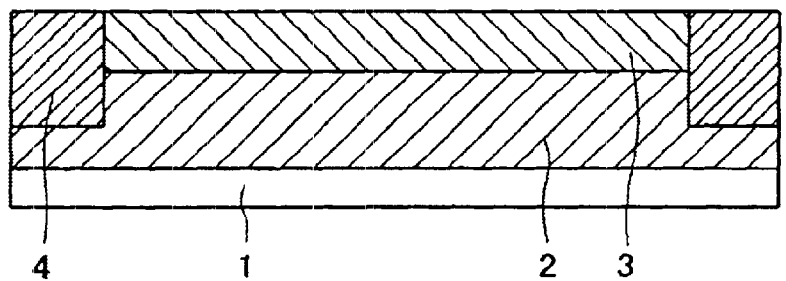
FIGS. 3A to 3C are partial sectional views showing the steps of producing the HBT of FIG. 2.
Figure 3B:
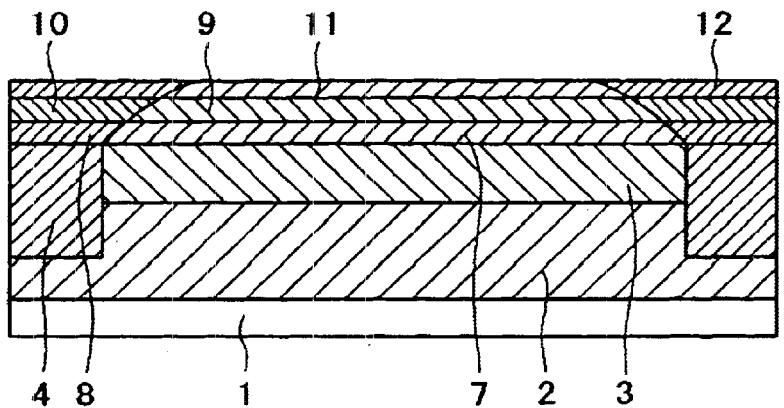
Figure 3C:
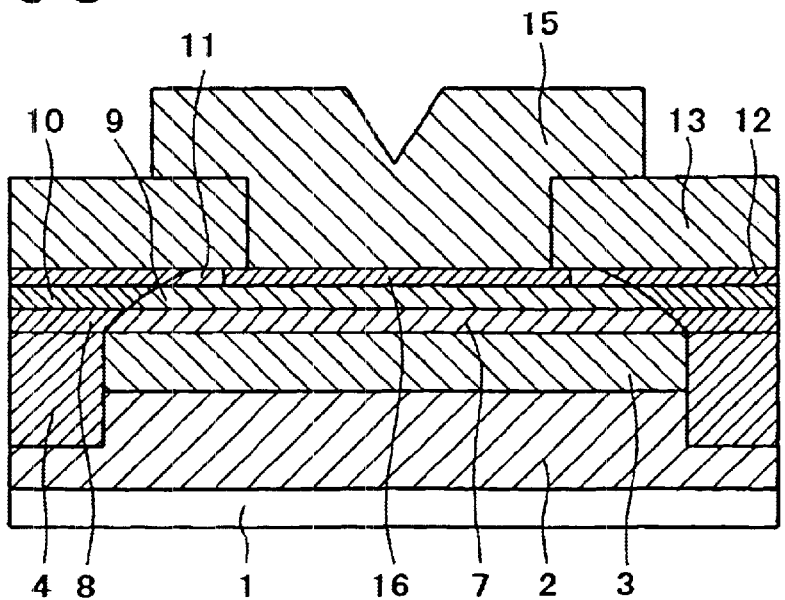

The HBT constructed as shown in FIG. 2 is manufactured according to the flow diagram shown in FIG. 3. The flow diagram shows major steps as well as the longitudinal sectional structure in the vicinity of the main region.

On the Si substrate 1 is formed the layer 2 of heavily doped n-type single-crystal Si. On this layer is formed by epitaxial growth a layer 3 of n-type single-crystal Si (which becomes the collector). This epitaxial growth should preferably be carried out by chemical vapor deposition (CVD). During the growth, an n-type impurity, such as P, is introduced. The impurity concentration is preferably no higher than $5 \times 10^{17}$ cm$^{-3}$ so that the base-collector breakdown voltage will not decrease and the base-collector capacitance will not increase. After that, the collector-base isolation film 4 is formed. (See FIG. 3A.)

Then, the layers of n-type SiGe 7 and 8, p-type SiGeC 9 and 10, and n-type Si 11 and 12 are sequentially formed on the surface of the substrate. At this time, the layer 7 of n-type single-crystal SiGe, the layer 9 of p-type single-crystal SiGeC, and the layer 11 of n-type single-crystal Si grow on the exposed surface of the layer 3 of n-type single-crystal Si. The layer 8 of n-type polycrystalline SiGe, the layer 10 of p-type polycrystalline SiGeC, and the layer 12 of n-type polycrystalline Si grow on the collector-base isolation film 4. (See FIG. 3B.)

The epitaxial growth used in the above-mentioned steps will be explained in more detail. It is possible to carry out epitaxial growth by molecular beam epitaxy (MBE) or CVD. CVD is suitable for the manufacture of transistors because it can be applied efficiently to a substrate with a large diameter. The following description relates to the CVD method.

To begin with, the substrate, with the layer 3 of single-crystal Si exposed, is cleaned so as to remove particles, organic contaminants, metallic contaminants, and natural oxide film from the surface of the substrate. Cleaning is accomplished with a mixture of deionized water, ammonia, and hydrogen peroxide. Surface oxide is removed with the aid of aqueous solution of hydrofluoric acid. Cleaning is completed by rinsing with deionized water. Cleaning in this manner creates the substrate surface which is terminated with hydrogen atoms. Consequently, the formation of a natural oxide film is prevented. The substrate is placed in an apparatus for epitaxial growth and is transferred to a reaction chamber under an ultra high vacuum. The substrate is cleaned to remove contaminants and natural oxide film (which might have deposited on its surface during transfer) immediately before epitaxial growth. This cleaning is accomplished by heating in an atmosphere of hydrogen at 800° C. or above for several minutes. Heating in this manner removes contaminants and natural oxide film from the surface of the layer of single-crystal Si, and produces a clean surface.

The substrate temperature is reduced to the growth temperature. Epitaxial growth is performed sequentially for the layer 7 of n-type single-crystal SiGe, the layer 9 of p-type single-crystal SiGeC, and the layer 11 of n-type single-crystal Si. The typical CVD method falls under two categories: (1) ultra high vacuum CVD (UHV/CVD) which performs growth at a very low pressure by supplying a small amount of source gases into a chamber which is being exhausted by a turbo-molecular pump; and (2) low-pressure CVD which performs growth while supplying a large amount of hydrogen. The former method (UHV/CVD) performs growth at a low temperature and consequently it employs a highly reactive source gases. For example, this method preferably employs disilane (Si$_2$H$_6$) as a source gas of Si and germane (GeH$_4$) as a source gas of Ge, if it is to grow the layer of SiGe. In addition, it preferably uses, as a source gas of C, monomethylsilane (CH$_3$SiH$_3$), dimethylsilane ((CH$_3$)$_2$SiH$_2$), trimethylsilane ((CH$_3$)$_3$SiH), methane, ethylene, acetylene, etc. The compositional ratio of C can be controlled by changing the flow rate of these gases. The gas flow rate should be adequately controlled so that the pressure in the growth chamber does not increase because growth takes place in molecular flow region. The pressure in the growth chamber changes depending on the shape of the growth chamber and the pumping speed. A pressure lower than about 1 Pa ensures uniform growth. The growth temperature should be no higher than 650° C. so that the epitaxially grown layer has good crystallinity and no lower than 500° C. so that the growth time is adequately short to ensure high throughput. Preferably a growth temperature of 550° C. is used to perform epitaxial growth at high throughput to manufacture a film having good crystallinity and a well-controlled thickness.

One way to control the compositional ratio in the SiGe layer is to change the ratio of the flow rate of source gases. For example, epitaxial growth at 550° C. with Si$_2$H$_6$ at a flow rate of 2.0 mL/min and GeH$_4$ at a flow rate of 10.5 mL/min gives rise to an SiGe layer whose compositional ratio of Ge is 30%. Likewise, epitaxial growth with Si$_2$H$_6$ at a flow rate of 2.0 mL/min, GeH$_4$ at a flow rate of 10.5 mL/min, and CH$_3$SiH$_3$ at a flow rate of 0.70 mL/min gives rise to an SiGeC layer whose compositional ratio of Ge is 30% and whose compositional ratio of C is 3%. Also, it is possible to carry out doping if a gas containing an impurity is supplied simultaneously with epitaxial growth. An example of the gas used for p-type doping is diborane (B$_2$H$_6$) or the like which contains a Group III element such as B. An example of the gas used for n-type doping is phosphine (PH$_3$) or arsine (AsH$_4$) which contains a Group IV element such as P and As. Doping can also be achieved simultaneously with epitaxial growth by diffusion or ion implantation.

Epitaxial growth by the low-pressure CVD method is accomplished by supplying a source gases together with a large amount of hydrogen (as a carrier gas). The source gases should have an adequate degree of reactivity. An excessively reactive gas undergoes reaction in the gas phase and deposits a film which is poor in crystallinity. Therefore, a desirable source gases for Si is preferably selected from monosilane (SiH$_4$), dichlorosilane (SiH$_2$Cl$_2$), and silicon hydride or chloride. Likewise, a desirable source gases for Ge is preferably selected from germanium hydride such as GeH$_4$ or chloride. The growth pressure is determined primarily by the pressure of hydrogen gas; it is usually about 1000 Pa to 10000 Pa. The growth temperature should be adequate for both gas decomposition and good crystallinity; it is preferably about 600° C. to 800° C. As in the case of UHV/CVD, it is possible to control the compositional ratio by changing the flow rate of gases. The same growth method as mentioned above can be applied to other layers.

Figure 4:
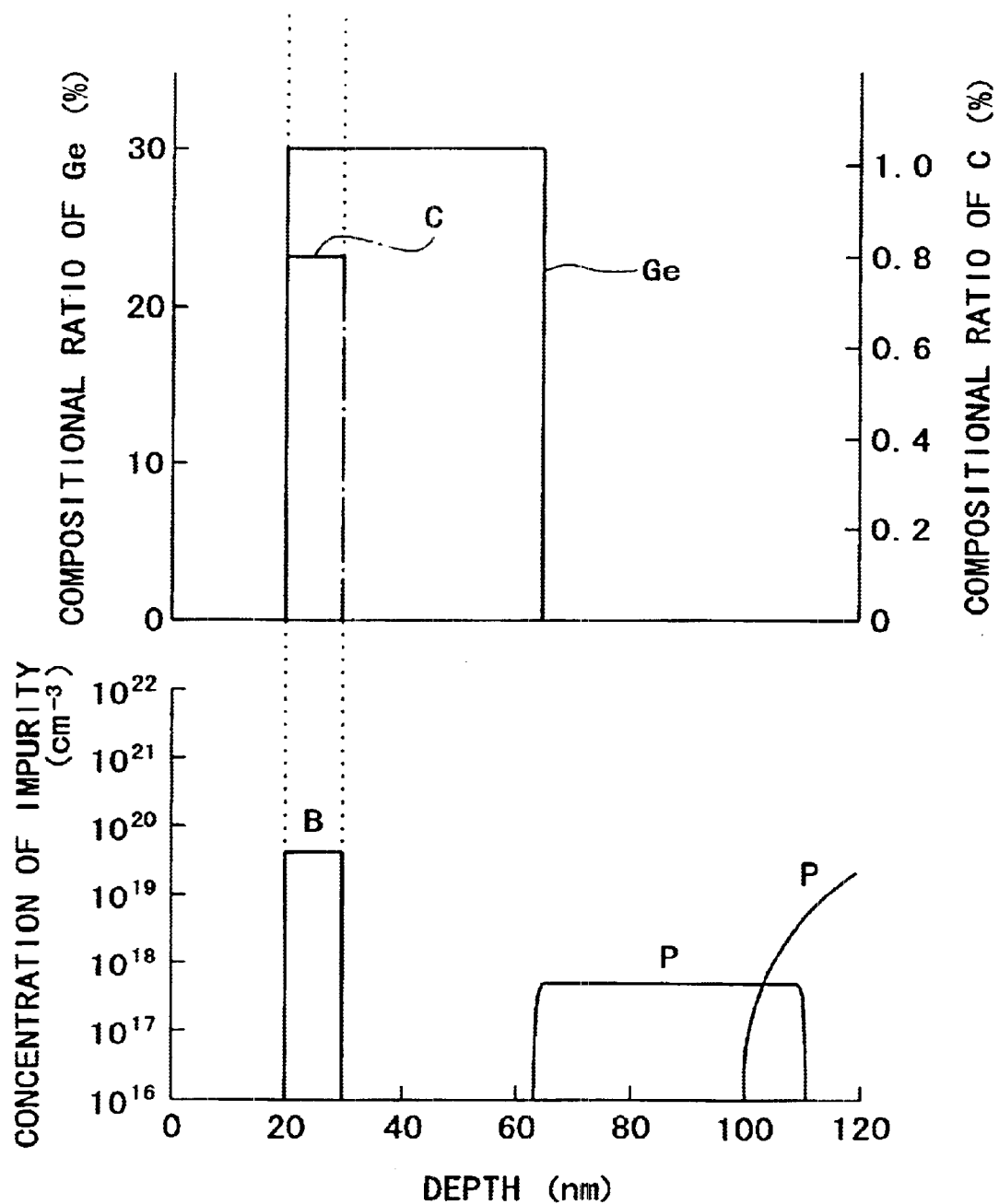
FIG. 4 is a diagram showing the profiles of compositional ratio of Ge and C and impurity concentration which were observed immediately after the semiconductor multilayered film of FIG. 1 had been formed.

FIG. 4 is a diagram showing the profile of both the compositional ratio of Ge and C and the impurity concentration which were observed immediately after the semiconductor multilayered film (as shown in FIG. 1) had been formed by epitaxial growth. The upper part of FIG. 4 shows the compositional ratio of Ge and C, and the lower part of FIG. 4 shows the profile of impurity concentration at the corresponding positions. The lateral axis in the upper and lower parts of FIG. 4 represents the depth from the surface of the growth layer and they correspond to each other.

To improve the performance of HBTs, it is necessary to reduce the thickness of the base layer, thereby decreasing the transit time of electrons. If the thickness of the base layer is reduced without change in the impurity concentration in the base, the base resistance increases. On the other hand, for a circuit with a bipolar transistor to operate fast, it is necessary to reduce the base resistance. To achieve this object, it is necessary to increase the impurity concentration in the base.

However, if the impurity concentration in the base is increased, the collector current decreases and hence the current gain decreases.

It is possible to increase the current gain while keeping the base resistance low, if the heterojunction is employed which lowers the bandgap of the base.

In addition, thermal processing following epitaxial growth causes impurities to diffuse, thereby expanding the base width. This drawback can be avoided if C is incorporated into the base. In other words, C incorporation into the base can suppress the diffusion of impurities because carbon atoms incorporated into the substitutional sites readily displace the interstitial Si atoms present in the epitaxial layer, thereby reducing the concentration of Si atoms in the substitutional sites. This makes B atoms less diffusible through Si atoms in the epitaxial layer. Moreover, C has a strong covalent bond. Therefore, the addition of C to the SiGe layer causes the bandgap to increase in proportion to the compositional ratio of C.

For the above-mentioned effects to show up, it is necessary that C atoms are incorporated into the substitutional sites. However, it is hard to increase the concentration of C because the solubility of C is low in the layers of single-crystal Si and single-crystal SiGe. For this reason, the upper limit of the compositional ratio of C is about 5%.

In order to produce the effect of decreasing the bandgap of the base even though C is incorporated (or doped), it is necessary that the compositional ratio of Ge in the base be higher than 5%. Moreover, the lattice constant of Ge is larger than that of Si by about 4.2%. Therefore, if an SiGe layer is formed on an Si substrate by epitaxial growth, the grown layer will contain a strain in proportion to the compositional ratio of Ge.

On the other hand, since C has a smaller lattice constant than Si and Ge, the layer of single-crystal SiGe will have a reduced strain if it is incorporated with C. For example, if the layer of single-crystal SiGeC which has grown on the substrate of single-crystal Si has a compositional ratio of Ge to C of about 8.5 and lattice strain is extremely reduced. If the layer of SiGe is formed with a high compositional ratio of Ge and a large film thickness, it is likely to incur lattice defects due to strain relaxation. Therefore, the upper limit of the compositional ratio of Ge should preferably be about 50%. For an HBT to have a cut-off frequency higher than 150 GHz, the base should have a thickness of about 10 nm. The impurity concentration should be no lower than $1 \times 10^{19}$ cm$^{-3}$ (so as to prevent the base from increasing in resistance) and no higher than $1 \times 10^{21}$ cm$^{-3}$ (so as to keep good crystallinity). For C to produce its effect of preventing the diffusion of B atoms, C atoms are preferably introduced more than B atoms, with the lower limit being about $1 \times 10^{19}$ cm$^{-3}$.

After the single-crystal layers have been formed as mentioned above, the emitter-base isolation film 13 is formed. An opening is made at the emitter part of the emitter-base isolation film 13, and then the layer 15 of heavily doped n-type polycrystalline Si is formed which becomes the emitter lead-out electrode. Annealing is performed at a high temperature for a short time so that the n-type impurity diffuses from the electrode 15 of emitter lead-out into the layer 11 of n-type single-crystal Si. In this way the emitter region 16 is formed. The n-type impurity is P and its concentration is no lower than about $1 \times 10^{20}$ cm$^{-3}$ so that the emitter will not unduly increase in resistance. The above-mentioned steps complete the main region of the HBT in this example. (See FIG. 3C.)

Figure 5:
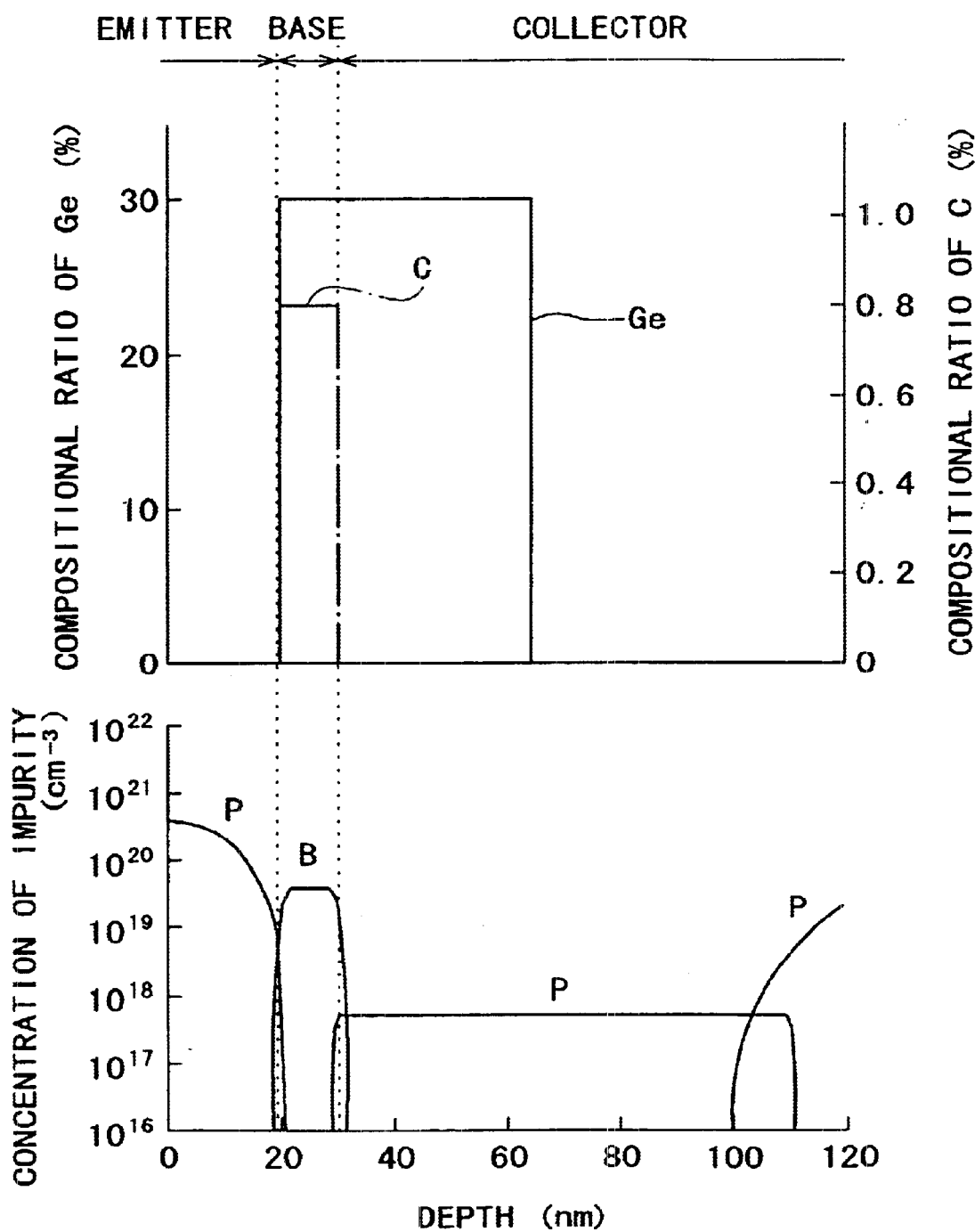
FIG. 5 is a diagram showing the distribution of the compositional ratio of Ge and C and the distribution of impurity which were observed after the main regions in the HBT had been formed by annealing (to form the emitter) the semiconductor multilayered film having the compositional ratio of Ge and C and the profile of impurity concentration as shown in FIG. 4.

After the emitter has been formed, both the profile compositional ratio of Ge to C and the impurity concentration shown in FIG. 4 change into those shown in FIG. 5. FIG. 4 and FIG. 5 are the same in arrangement. It is noted that the addition of C to the base layer prevents the diffusion of B (as an impurity) and keeps the base width shallow.

Figure 6A:
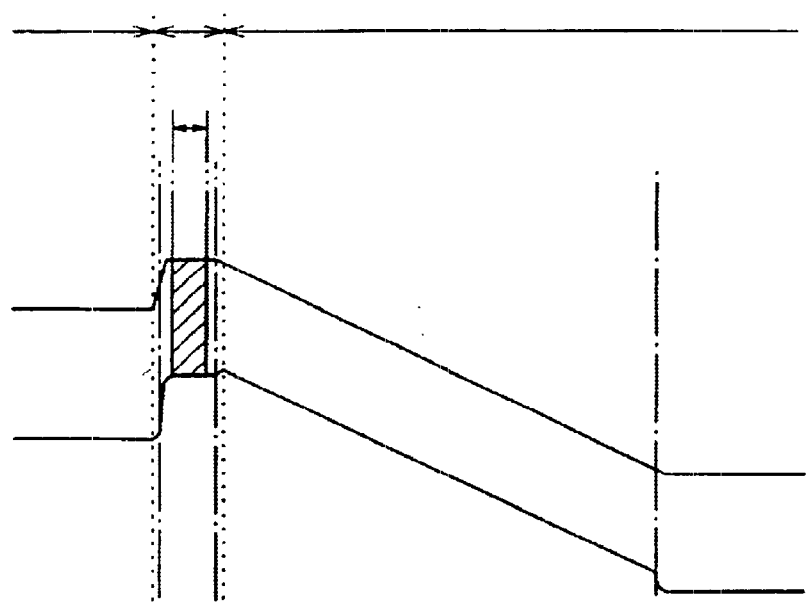
FIGS. 6A to 6B are diagrams showing the energy band structure which occurs when the electrons injected from the emitter increases and the neutral base extends toward the collector, while an HBT of the present invention is in the normal operating state and another state respectively.
Figure 6B:
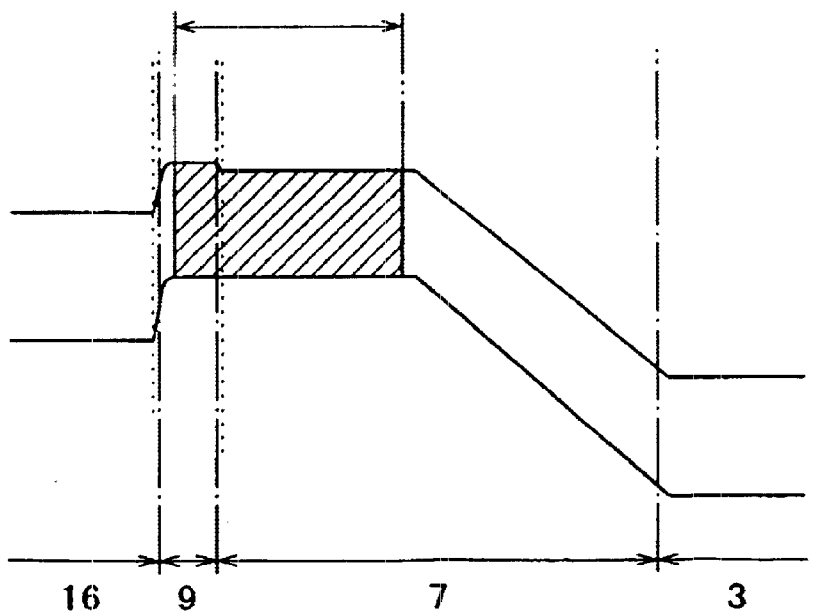

The HBT having the profile of compositional ratios of Ge and C and the impurity concentration as shown in FIG. 5 has the energy band structure as shown in FIG. 6. FIG. 6A shows the energy band structure of the HBT in normal operating state, and FIG. 6B shows the energy band structure of the HBT in such a state that the injection of electrons from the emitter is large and the neutral base region extends into the layer 7 of n-type single-crystal SiGe. Each of FIGS. 6A and 6B shows the lower end of the conduction band and the upper end of the valence band. Reference numeral 16 stands for the emitter, 9, the base, and 7 and 3, the collector.

Keeping the bandgap of the collector (which is the layer 7 of n-type single-crystal SiGe) smaller than that of the base (which is the layer 9 of p-type single-crystal SiGeC) produces the following effect. When the neutral base extends due to large injection of electrons from the emitter, carriers are accelerated by the step which is formed in the conduction band in response to the difference between bandgaps. This permits the transistor to work fast. For example, if the compositional ratio of Ge is the same in the layer 9 of p-type single-crystal SiGeC and the layer 7 of n-type single-crystal SiGe, then there occurs an energy difference corresponding to the compositional ratio of C. In this case it is possible to accelerate carriers if the compositional ratio of Ge is increased in the layer 7 of n-type single-crystal SiGe.

If a source gas of C is introduced when the layer of single-crystal SiGeC is formed, C inhibits the surface reaction. Therefore, the growth rate increases as the compositional ratio of C decreases. This means that it is possible to reduce the growth time compared with the layer of single-crystal SiGeC having the same thickness as the collector. In this way it is possible to improve the throughput in the production of transistors.

EXAMPLE 2

FIG. 7 is a sectional view showing the structure of the HBT according to a second preferred example of the present invention. Unlike the HBT shown in FIG. 1, this HBT preferably has its main region formed by the self-aligned process. First, on the Si substrate 1 are sequentially formed the layer 2 of heavily doped n-type single-crystal Si (which becomes the collector) and the layer 3 of n-type single-crystal Si. Then, the collector-base isolation film 4 is formed on the part excluding the region which becomes the main region of the transistor. A trench is formed in the region between adjoining transistors. The trench is filled with the isolation film 5 and isolation film 21, so that the isolation region is formed. Then, on the substrate are formed by deposition the collector-base isolation films 22 and 23, the layer 24 of p-type single-crystal Si (which becomes the base lead-out electrode), and the emitter-base isolation film 13. Then, an opening is made in the emitter-base isolation film 13 and the layer 24 of polycrystalline Si, and the emitter-base isolation film 24 is formed on the lateral side of the opening. Then, the layer 26 of n-type single-crystal Si (which becomes the collector) is formed by ion implantation in the opening. The collector-base isolation films 23 and 22 in the opening are removed by etching, so that the surface of the layer 3 of n-type single-crystal Si is exposed. Selective epitaxial growth is performed to sequentially form only in this opening the layer 7 of n-type single-crystal SiGe (which becomes the collector), the layer 9 of heavily doped p-type single-crystal SiGeC (which becomes the base), and the layer 11 of n-type single-crystal Si (which becomes the emitter). The layer 15 of n-type polycrystalline Si (which becomes the emitter lead-out electrode) is formed. Then, annealing is performed to cause P to diffuse from the layer 15 of n-type polycrystalline Si into the layer 11 of n-type single-crystal Si, thereby forming the emitter 16. The isolation film 17 is deposited over the entire surface of the substrate. An opening is made at the collector part, and then the layer 6 of heavily doped n-type single-crystal Si (which becomes the collector lead-out electrode) is formed. Finally, an opening is made in the emitter part and the base part. The emitter electrode 18, the base electrode 19, and the collector electrode 20 are formed.

Figure 8A:
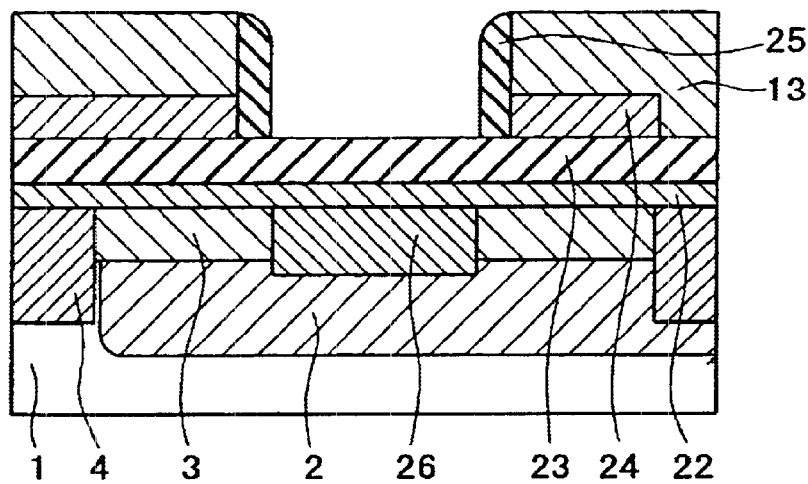
FIGS. 8A to 8C are partial sectional views showing the steps of producing the HBT of FIG. 7.
Figure 8B:
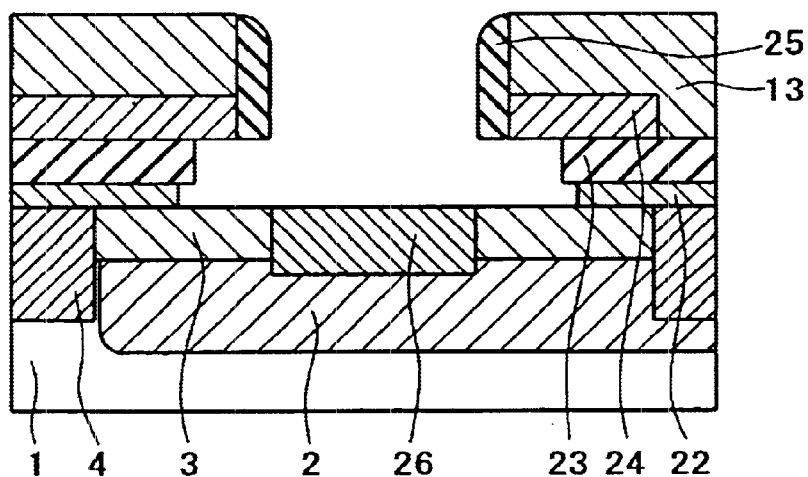
Figure 8C:
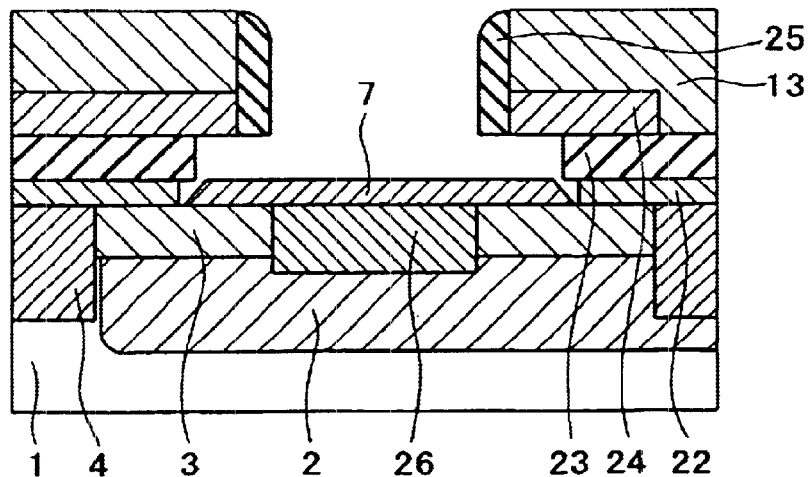
Figure 9A:
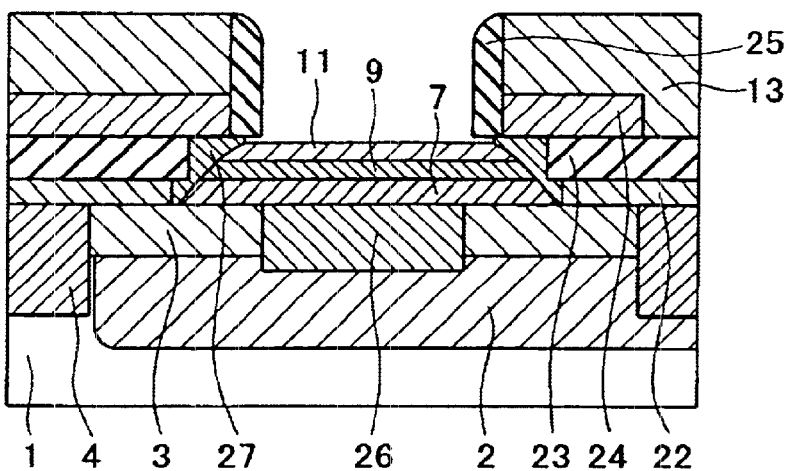
FIGS. 9A to 9C are partial sectional views showing the steps of producing the HBT which follow the steps shown in FIG. 8.
Figure 9B:
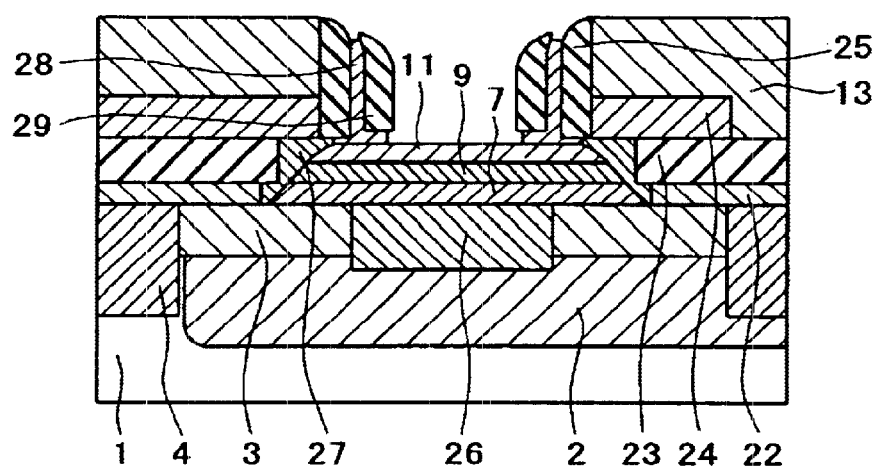
Figure 9C:
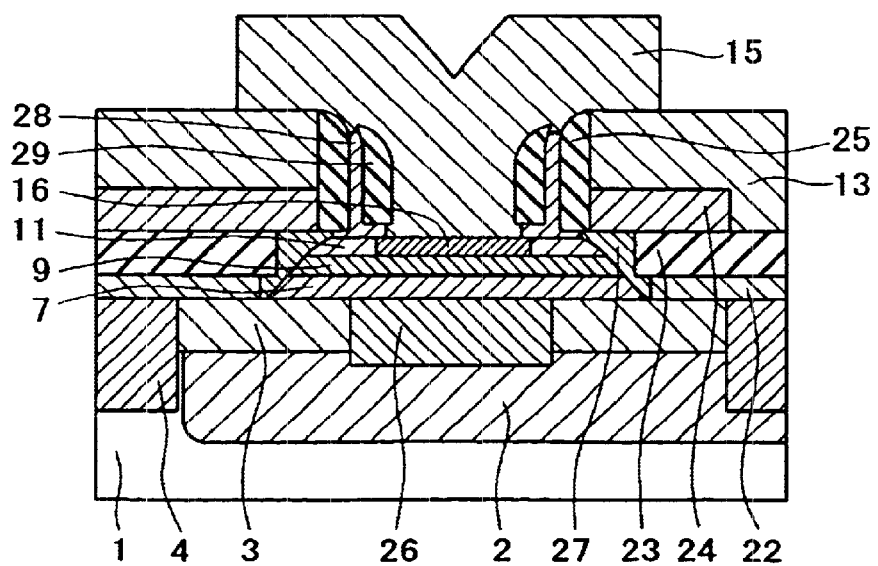

The HBT constructed as shown in FIG. 7 is manufactured according to the flow diagrams shown in FIGS. 8 and 9. The flow diagrams show major steps as well as the longitudinal sectional structure in the vicinity of the main region.

On the Si substrate 1 is formed first the layer 2 of heavily doped n-type single-crystal Si (which is a buried layer). On this layer is formed by epitaxial growth the layer 3 of n-type single-crystal Si (which becomes the collector). This epitaxial growth is preferably carried out by CVD. The n-type impurity is preferably P, and the impurity concentration is preferably no higher than $5 \times 10^{17}$ cm$^{-3}$ so that the base-collector breakdown voltage will not decrease and the base-collector capacitance will not increase.

Then, the collector-base isolation film 4 and the isolation region are formed. CVD is continued to sequentially form the Si oxide film 22 and the Si nitride film 23 (which becomes the collector-base isolation film), the layer 24 of p-type polycrystalline Si (which becomes the base lead-out electrode), and the emitter-base isolation film 13. After that, the emitter-base isolation film 13 and the layer 24 of p-type polycrystalline Si are formed. Then, the emitter-base isolation film 25 is formed on the side wall of the opening. Then, the layer 26 of n-type single-crystal Si (which becomes the heavily doped collector) is formed in the opening by ion implantation. The impurity concentration is preferably about $1 \times 10^{18}$ cm$^{-3}$; otherwise, the depletion layer in the collector expands and the transit time of electrons in the collector increases, with the result that the transistor decreases in operating speed. (See FIG. 8A.)

Then, the collector-base isolation films 23 and 22 in the opening are sequentially removed by etching, so that the surface of the layer 3 of n-type single-crystal Si is exposed. In this step, the underside of the base lead-out electrode 24 is also exposed at the same time. (See FIG. 8B.)

Now, it is possible to form the collector, base, and emitter by selective epitaxial growth by forming the single-crystal layer only on the layer 3 of n-type single-crystal Si. It is suitable to carry out epitaxial growth by CVD or UHV/CVD which permits selective growth and is efficiently applicable to large-sized substrates. The low-pressure CVD method permits improvement in selectivity and reduction in growth time because after cleaning of the substrate surface at a high temperature growth is performed at a comparatively high temperature of about 700° C. By contrast, the UHV/CVD method permits growth at a comparatively low temperature (below 600° C.) because it employs a small amount of highly reactive gas. As the result, it is possible to obtain a uniform single-crystal layer regardless of gas flow, and it is also possible to accurately control the compositional ratios of Ge and C. These methods are not the only methods for realizing the structure in this example; any other methods are applicable if they exhibit selectivity on the oxide film and single crystal.

As in Example 1, the surface of the substrate is cleaned, and selective epitaxial growth is performed on only the surface of the layer 3 of single-crystal Si. Selective growth can be achieved by supplying the source gas together with a halogen-based gas (such as HCl and Cl$_2$) which easily brings about etching reaction. For example, in the case of the low pressure method, the source gas, which is composed of Si$_2$H$_6$ (2.0 mL/min) and GeH$_4$ (10.5 mL/min), is supplied with Cl$_2$(5 mL/min). In this way it is possible to selectively grow the SiGe layer in which the compositional ratio of Ge is 30%. Likewise, in the case of low-pressure CVD method, the source gas may be supplied together with HCl (20 mL/min) so that the desired selective growth is achieved.

There is a selective growth method which does not use any etching gas. It utilizes the fact that deposition starts at different time depending on the surface material. In the initial stage of growth, growth does not start owing to contaminants (such as oxide) and crystal surface state. The time before the start of deposition is called incubation time. The incubation time varies depending on the material and growth conditions. Epitaxial growth on a single-crystal substrate has substantially no incubation time if the surface has been cleaned. However, epitaxial growth on an oxide film has a long incubation time. Therefore, epitaxial growth takes place selectively only on the single-crystal until deposition on an oxide film starts. The incubation time on an oxide film can be extended if the amount of gas supply is reduced and the growth temperature is raised. It can also be extended if the compositional ratio of Ge is increased in SiGe. For example, under the condition that the growth temperature is 550° C. and the flow rates of Si$_2$H$_6$ and GeH$_4$ are 2.0 mL/min and 3.1 mL/min, respectively, selective growth more than 100 nm is possible for the SiGe layer in which the compositional ratio of Ge is 15%. The above-mentioned methods make it possible to selectively grow the layer 7 of n-type single-crystal SiGe on the layer of single-crystal Si in the opening. (See FIG. 8C).

Then, selective epitaxial growth is performed to form the layer 9 of p-type single-crystal SiGeC and the layer 11 of n-type single-crystal Si. This selective growth permits the polycrystalline SiGeC layer and polycrystalline Si layer to deposit on the underside of the base lead-out electrode 24 which is a layer of heavily doped p-type polycrystalline Si. If the Si substrate has a plane orientation of (100), the polycrystalline Si which has surface plane orientation of (111) and (311) is formed, and the growth rate on these planes is low. The result is that the layers of polycrystalline SiGeC and polycrystalline Si are thinner than the single-crystal layer. In addition, because the growth rate under reduced pressure is more dependent on the plane orientation, it is preferable to reduce the growth pressure when the n-type SiGe layer 9 is grown and it is preferable to increase the growth pressure when the p-type SiGeC layer 11 is grown. In this way it is possible to directly connect together the main base and the extrinsic base 27 with low resistance at the joint. (See FIG. 9A.) Incidentally, the above-mentioned conditions (growth temperature, gas flow rate, pressure, etc.) can be changed within an extent in which selective growth is possible. For example, in the case of growing the layer 9 of heavily doped p-type single-crystal SiGeC, selectivity becomes poorer as the compositional ratio of C increases. This situation can be avoided if the growth temperature is raised, the gas flow rate is reduced, and the growth pressure is lowered when compared to the case of the layer 7 of n-type single-crystal SiGe and the layer 11 of n-type single-crystal Si.

As mentioned above, after the multilayered film has been formed, the emitter-base isolation films 28 and 29 are sequentially formed on the side wall of the opening. (See FIG. 9B.) Then, the layer 15 of p-type polycrystalline Si containing P in high concentrations (which becomes the emitter lead-out electrode) is deposited. Annealing is performed so that P diffuses into the layer 11 of n-type single-crystal Si. In this way the emitter 16 is formed. (See FIG. 9C.) Now, the impurity concentration is preferably no lower than about $1 \times 10^{20}$ cm$^{-3}$ so that the emitter resistance does not increase excessively. After that, the layer 15 of p-type polycrystalline Si is removed except for the opening and its periphery. The above-mentioned steps complete the main region of the HBT which employs SiGeC in this example.

This example is characterized in that the layer 9 of heavily doped p-type single-crystal SiGeC (which is the main base) and the layer 24 of heavily doped p-type polycrystalline Si (which is the base lead-out electrode) are jointed together by self-alignment through the extrinsic base layer 27 (which is the layer of heavily doped p-type polycrystalline SiGeC). This structure reduces parasitic resistance and parasitic capacitance more than that in Example 1. Therefore, the HBT in this example is capable of high-speed operation.

EXAMPLE 3

FIG. 10 is a sectional view showing the main region of the HBT according to a third preferred example of the present invention. The difference between Example 1 and Example 3 is that the layer 30 of n-type single-crystal SiGeC (which becomes a part of the collector) is interposed between the layer 7 of n-type single-crystal SiGe (as part of the collector) and the layer 9 of heavily doped p-type single-crystal SiGeC (the base). At the interface between layer 9 and layer 30, the bandgap of the layer 30 adjacent to the layer 9 is preferably smaller than that of the layer 9 adjacent to the layer 30.

The preferred HBT of this example makes it possible to reduce the bandgap of the layer 30 of n-type single-crystal SiGeC (in the collector) and the layer 7 of n-type single-crystal SiGe more than that of the base layer. Therefore, an energy step appears in the conduction band at the depletion layer of the base-collector junction when the injection of electrons from the emitter is large. Since this energy step accelerates carriers, the HBT operates fast even when the injection level is high. Moreover, the addition of C into not only the base layer but also the collector side prevents the thermal diffusion of B, thereby making it possible to reduce the base width. Moreover, the incorporation of C compensates for the strain in the layer 30 of n-type single-crystal SiGeC (the collector). Thus it is possible to suppress the generation of crystal defects due to strain relaxation even after annealing at a high temperature. This leads to improvement in the yields of HBTs.

EXAMPLE 4

FIG. 11 is a sectional view showing the main region of the HBT according to a fourth preferred example of the present invention. Reference numeral 3 in FIG. 11 denotes the layer of n-type single-crystal Si which becomes a part of the collector. On this layer are sequentially formed the layer 30 of n-type single-crystal SiGeC (which becomes a part of the collector), the layer 31 of heavily doped p-type single-crystal SiGe (which becomes the base), and the layer 16 of n-type single-crystal Si (which becomes the emitter).

The incorporation of C to the single-crystal Si layer or single-crystal SiGe layer prevents the thermal diffusion of B. However, since the solubility of C is low in the single-crystal Si layer or single-crystal SiGe layer, the single-crystal layer containing C becomes poor in crystallinity when the compositional ratio of C increases or the temperature of epitaxial growth is high. Incorporating C simultaneously with the doping of B in high concentrations causes trouble due to combination of B and C. In this example, C is not incorporated into the base layer 31 but is incorporated only to layer 30 of the collector. In this way it is possible to prevent the diffusion of B from the layer 31 of p-type single-crystal SiGe to layer 30 in the collector and to suppress the leakage current in the HBT.

EXAMPLE 5

FIG. 12 is a sectional view showing the main region of the HBT according to a fifth preferred example of the present invention. The difference between Example 4 and Example 5 is that the layer 7 of n-type single-crystal SiGe (which becomes a part of the collector) is interposed between the layer 3 of n-type single-crystal Si (in the collector) and the layer 30 of n-type single-crystal SiGeC. At the interface between layer 30 and layer 7, the bandgap of the layer 7 adjacent to the layer 30 is preferably smaller than that of the layer 30 adjacent to the layer 7.

According to this example, an energy step appears in the conduction band at the interface between layer 30 and the layer 7 when the injection of electrons from the emitter is large. This energy step accelerates carriers, permitting the HBT to operate fast. Moreover, since the SiGe layer grows faster than the SiGeC layer, it is possible to reduce the growth time as compared with the case in which the layer of single-crystal SiGeC has almost the same thickness as the collector. This contributes to improvement in throughput in the production of transistors.

EXAMPLE 6

FIG. 13 is a sectional view showing the main region of the HBT according to a sixth preferred example of the present invention. The difference between Example 3 and Example 6 is that the layer 32 of n-type single-crystal SiGe (which becomes a part of the emitter) is interposed between the layer 9 of p-type single-crystal SiGeC (the base) and the layer 16 of n-type single-crystal Si. At the interface between layer 32 and layer 9, the bandgap of the layer 9 adjacent to the layer 32 is preferably smaller than that of the layer 32 adjacent to the layer 9. Thus, a step is preferably made by adjusting the compositional ratio of Ge in response to the compositional ratio of C in the base. The diffusion of P introduced from the emitter is suppressed by the layer 32 of n-type single-crystal SiGe. If the depletion layer at the emitter-base junction expands, the transit time of carriers increases and hence the operating speed of the transistor decreases. Therefore, the layer 32 of n-type single-crystal SiGe is preferably no thicker than 10 nm.

Figure 14:
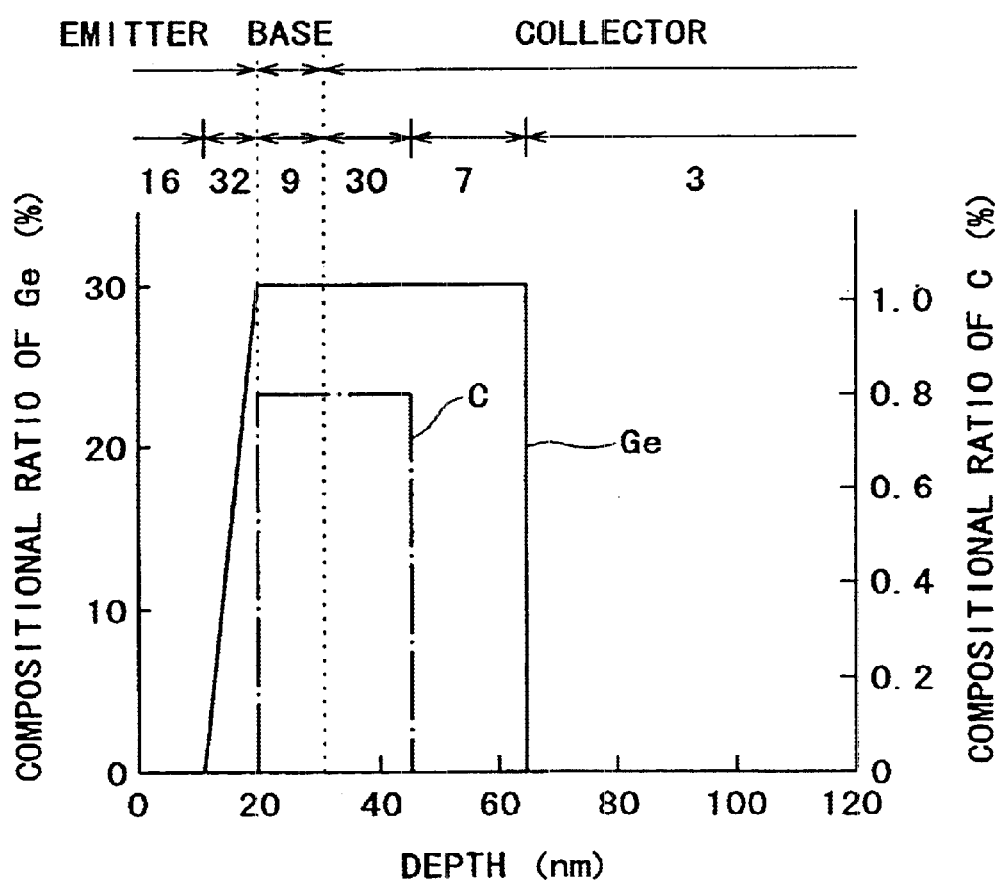
FIG. 14 is a diagram showing the profile of compositional ratio of Ge and C in the HBT of FIG. 13.

FIG. 14 shows the profile of the compositional ratios of Ge and C in the HBT according to this example. It is noted that the diffusion of B (as an impurity in the base) is suppressed more as the compositional ratio of Ge increases as in the case where C is incorporated. Therefore, this example makes it possible to produce an HBT having a shallow base width. This HBT produces not only the same effect as mentioned in Example 3 but also the effect of improving the operating speed. As shown in FIG. 14, increasing the compositional ratio of Ge in going from the emitter to the base alleviates the strain at the interface between the layer 16 of n-type single-crystal Si and the layer 32 of n-type single-crystal SiGe, both constituting the emitter. This prevents the yields of HBT from decreasing due to defects induced by strain relaxation.

This preferred example can also be applied to an HBT in which the base is a layer 31 of p-type single-crystal SiGe. Here, the same effect as mentioned above is obtained if the compositional ratio of Ge of layer 32 is established in response to the bandgap of the base.

EXAMPLE 7

FIG. 15 is a sectional view showing the main region of the HBT according to a seventh preferred example of the present invention. The difference between Example 3 and Example 7 is that the layer 33 of n-type single-crystal SiC (which becomes a part of the emitter) is interposed between the layer 9 of p-type single-crystal SiGeC (the base) and the layer 16 of n-type single-crystal Si (in the emitter). At the interface between layer 33 and layer 9, the bandgap of the layer 9 adjacent to the layer 33 is preferably smaller than that of the layer 33 adjacent to the layer 9. A step is preferably made by adjusting the compositional ratio of C in response to the compositional ratio of Ge in the base. According to this example, the diffusion of B from the base 9 to layer 33 of the emitter is prevented by C in the layer 33 of the emitter as well as in the layer 9 of p-type single-crystal SiGeC. The resulting HBT produces not only the same effect as mentioned in Example 3 but also the effect of improving the operating speed. The fact that the bandgap of the emitter is larger than that in the layer of single-crystal Si permits the resulting HBT to have a larger current gain factor than that in Example 3.

Figure 16:
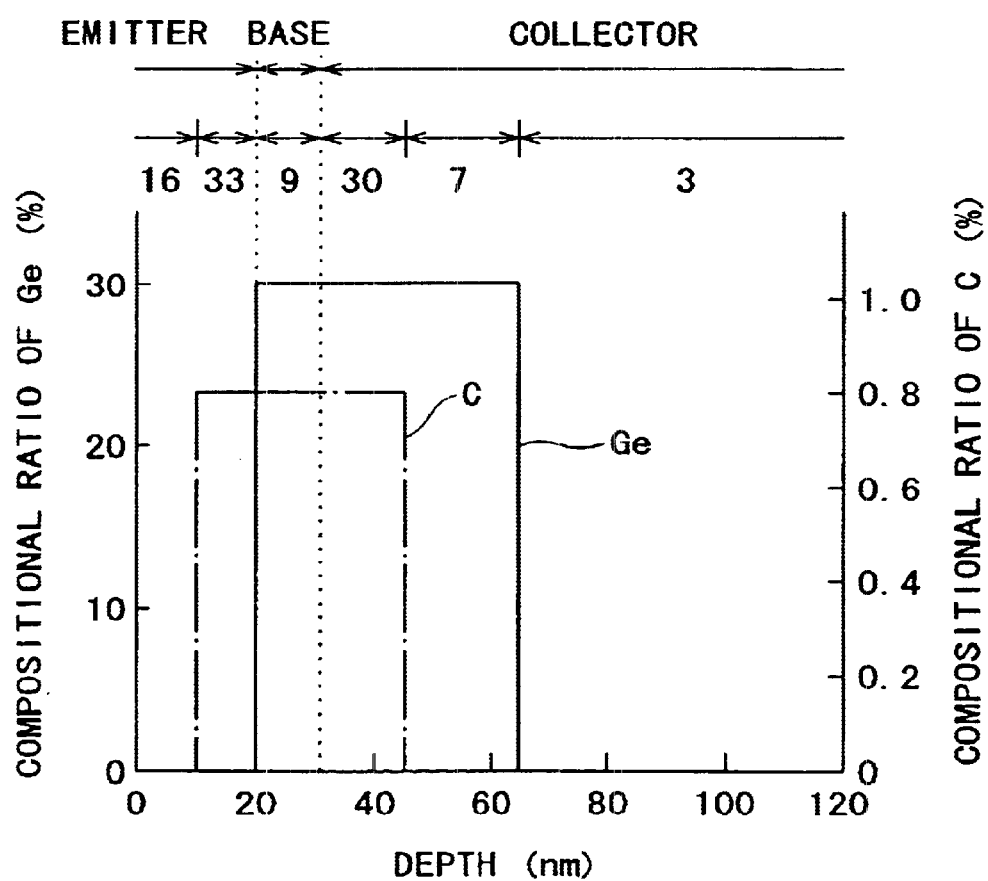
FIG. 16 is a diagram showing the profile of compositional ratio of Ge and C in the HBT of FIG. 15.

FIG. 16 shows the profile of the compositional ratios of Ge and C in the HBT according to this example. It is noted that if the compositional ratio of Ge is 30% in the layer 9 of p-type single-crystal SiGeC and the compositional ratio of C is 0.8% in the layer 33 of n-type single-crystal SiC and the layer 9 of p-type single-crystal SiGeC, then the bandgap in the layer of p-type single-crystal SiGeC is smaller than that of the layer 33 of n-Type single-crystal SiC. Consequently, it is not necessary to make a step in the compositional ratio of C at the interface between the layer 33 of n-type single-crystal SiC and the layer 9 of p-type single-crystal SiGeC.

This example can also be applied to an HBT in which the base is the layer 31 of p-type single-crystal SiGe. The same effect as mentioned above is obtained because at the interface between layer 33 and layer 31, the bandgap of the layer 31 adjacent to the layer 33 is preferably smaller than that of the layer 33 adjacent to the layer 31.

EXAMPLE 8

FIG. 17 is a sectional view showing the main region of the HBT according to an eighth preferred example of the present invention. The difference between Example 3 and Example 8 is that the layer 34 of n-type single-crystal SiGeC (which becomes a part of the emitter) is interposed between the layer 9 of p-type single-crystal SiGeC (the base) and the layer 16 of n-type single-crystal Si (as part of the emitter). The compositional ratios of Ge and C should be established such that at the interface between layer 34 and layer 9, the bandgap of the layer 9 adjacent to the layer 34 is preferably smaller than that of the layer 34 adjacent to the layer 9.

According to this preferred example, the diffusion of B from the base 9 to the layer 34 of the emitter is prevented by both Ge and C. The resulting HBT produces not only the same effect as mentioned in Example 3 but also the effect of improving the operating speed.

This example can also be applied to an HBT in which the base is the layer 31 of p-type single-crystal SiGe. The same effect as mentioned above is obtained if the compositional ratios of Ge and C of the layer 34 are established in response to the bandgap of the base.

EXAMPLE 9

FIG. 18 is a sectional view showing the main region of the HBT according to a ninth preferred example of the present invention. The difference between Example 3 and Example 9 is that the layer 33 of n-type single-crystal SiC and the layer 34 of n-type single-crystal SiGeC (both of which become a part of the emitter) are interposed between the layer 9 of p-type single-crystal SiGeC (the base) and the layer 16 of n-type single-crystal Si (as part of the emitter). At the interface between layer 34 and layer 9, the bandgap of the layer 9 adjacent to the layer 34 is preferably smaller than that of the layer 34 adjacent to the layer 9. And the compositional ratios of Ge and C should be established such that at the interface between layer 33 and layer 34, the bandgap of the layer 34 adjacent to the layer 33 is preferably smaller than that of the layer 33 adjacent to the layer 34. If the compositional ratios of Ge and C are properly adjusted, it is possible to prevent dislocations and defects at the heterointerface. The result is the suppressing of leakage current and impurity diffusion due to dislocations and defects.

According to this example, the diffusion of B from the base to the emitter is prevented by both Ge and C. The resulting HBT produces not only the same effect as mentioned in Example 3 but also the effect of improving the operating speed. Moreover, the fact that the bandgap of the emitter can be made larger than that of the single-crystal Si layer makes it possible to increase further the current gain of the HBT.

This example can also be applied to an HBT in which the base is the layer 31 of p-type single-crystal SiGe. The same effect as mentioned above is obtained if the compositional ratios of Ge and C of the layer 34 are established in response to the bandgap of the base.

EXAMPLE 10

Figure 19:
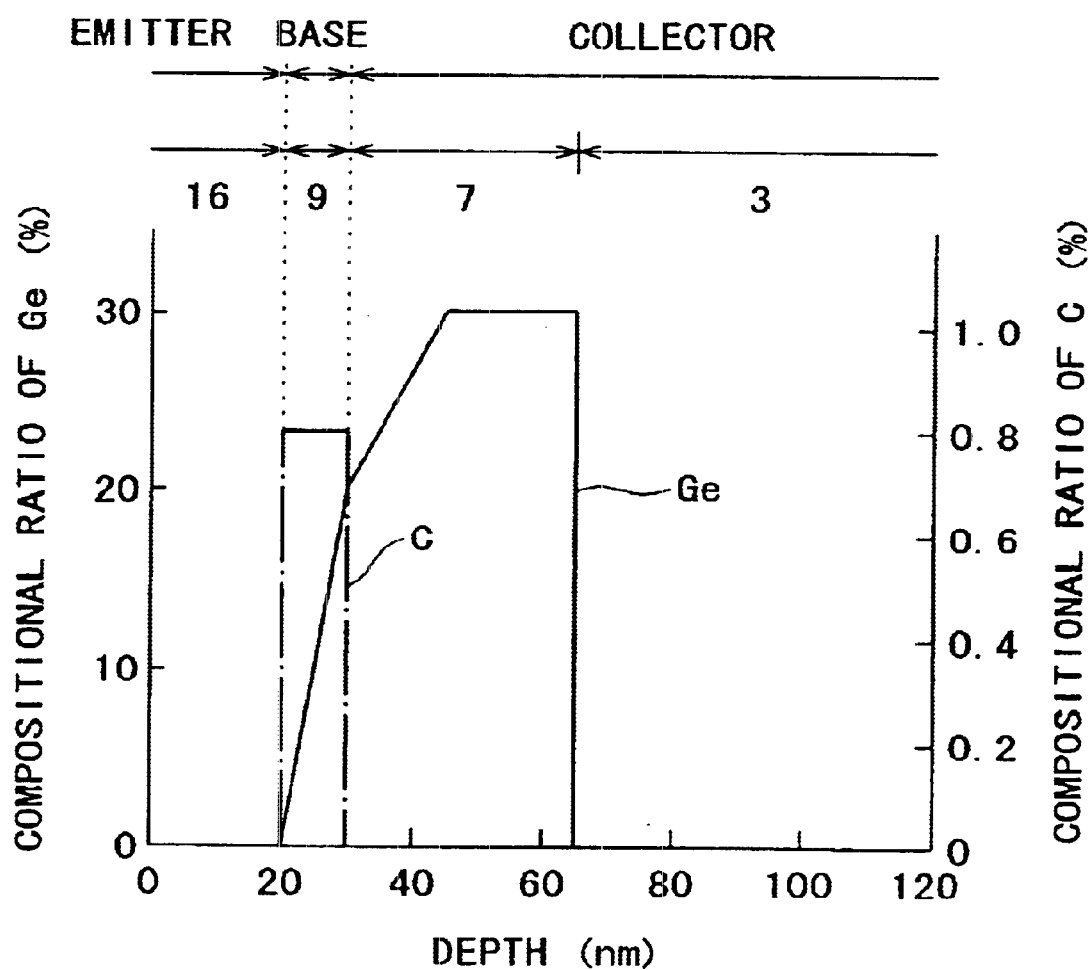
FIG. 19 is a diagram showing the profile of compositional ratio of Ge and C in the HBT pertaining to a tenth preferred embodiment of the present invention.

FIG. 19 shows the profile of the compositional ratios of Ge and C in the HBT according to a tenth preferred example of the present invention. The difference between Example 1 and Example 10 is that the compositional ratio of Ge increases in going from the emitter to the collector in at least part of the base and collector.

The HBT in this example operates faster than that in Example 1 because the inclined conduction band generates the drift electric field which accelerates electrons in the base or collector. Moreover, if the emitter comprises the layer 16 of single-crystal Si, it is possible to suppress dislocations and defects due to lattice strain at the interface between the layer 16 of single-crystal Si and the layer 9 of single-crystal SiGeC or the layer 31 of single-crystal SiGe. Thus, it is possible to suppress the generation of leakage current and dopant diffusion due to dislocations and defects. This helps improve yields and decrease fluctuations in characteristic properties. Moreover, the HBT in this example contains less strain in the semiconductor layer as compared with that in Example 1. This prevents the occurrence of dislocations and defects due to annealing, thereby improving yields and reducing fluctuations in characteristic properties.

EXAMPLE 11

Figure 20:
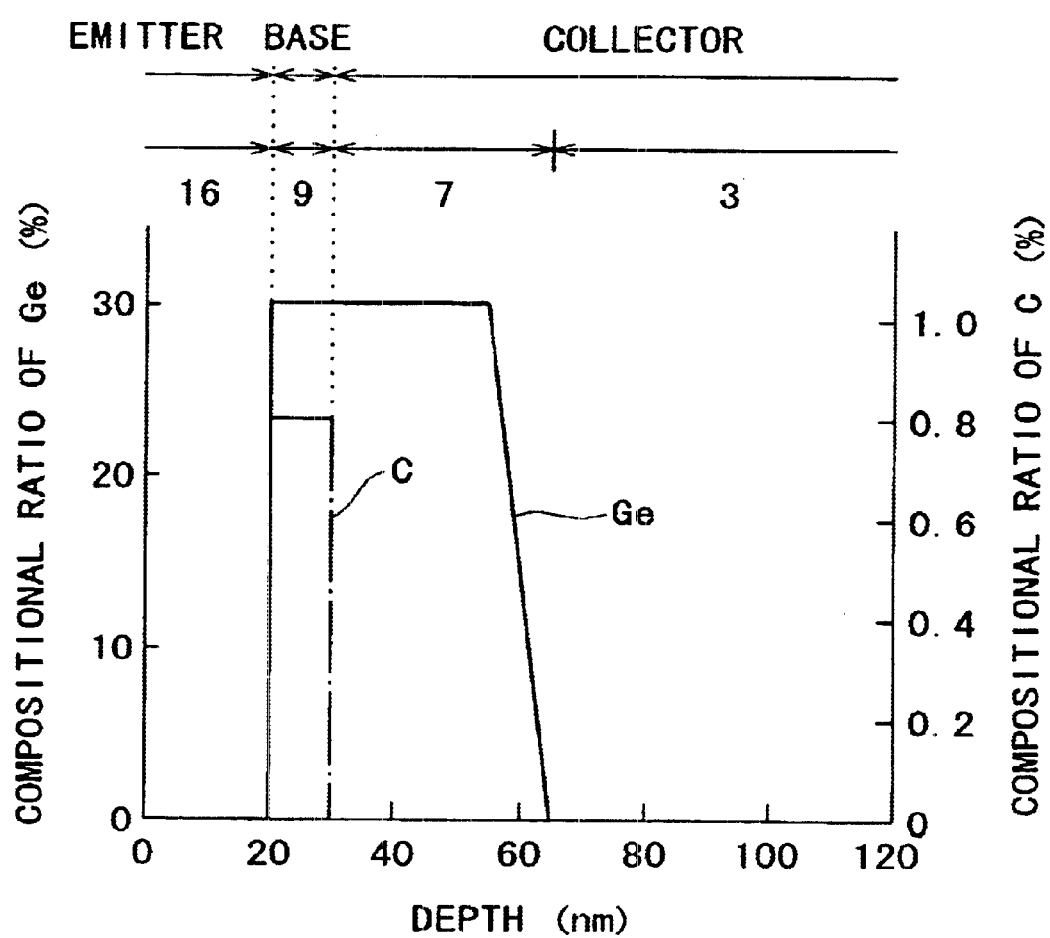
FIG. 20 is a diagram showing the profile of compositional ratio of Ge and C in the HBT pertaining to an eleventh preferred embodiment of the present invention.

FIG. 20 shows the compositional ratios of Ge and C in the HBT according to an eleventh preferred example of the present invention. The difference between Example 1 and Example 11 is that the compositional ratio of Ge decreases in going from the emitter to the collector in at least part of the layer of n-type single-crystal SiGe as the collector.

According to this example, it is possible to reduce the lattice strain at the interface between the layer 3 of single-crystal Si and the layer 7 of single-crystal SiGe (both forming the collector). This makes it possible to suppress dislocations and defects due to strain and hence to reduce leakage current and dopant diffusion due to these dislocations and defects. This helps improve the yields of HBTs and reduce fluctuations in characteristic properties.

According to FIG. 20, the compositional ratio of Ge continuously decreases to 0% at the heterointerface between the layer 3 of n-type single-crystal Si and the layer 7 of n-type single-crystal SiGe. Therefore, no energy barrier forms in the conduction band. The result is that the operating speed of the HBT is not adversely affected by the energy barrier impeding the diffusion of electrons.

The same effect as mentioned above is obtained even though the collector is formed with the layer 30 of n-type single-crystal SiGeC.

EXAMPLE 12

Figure 21:
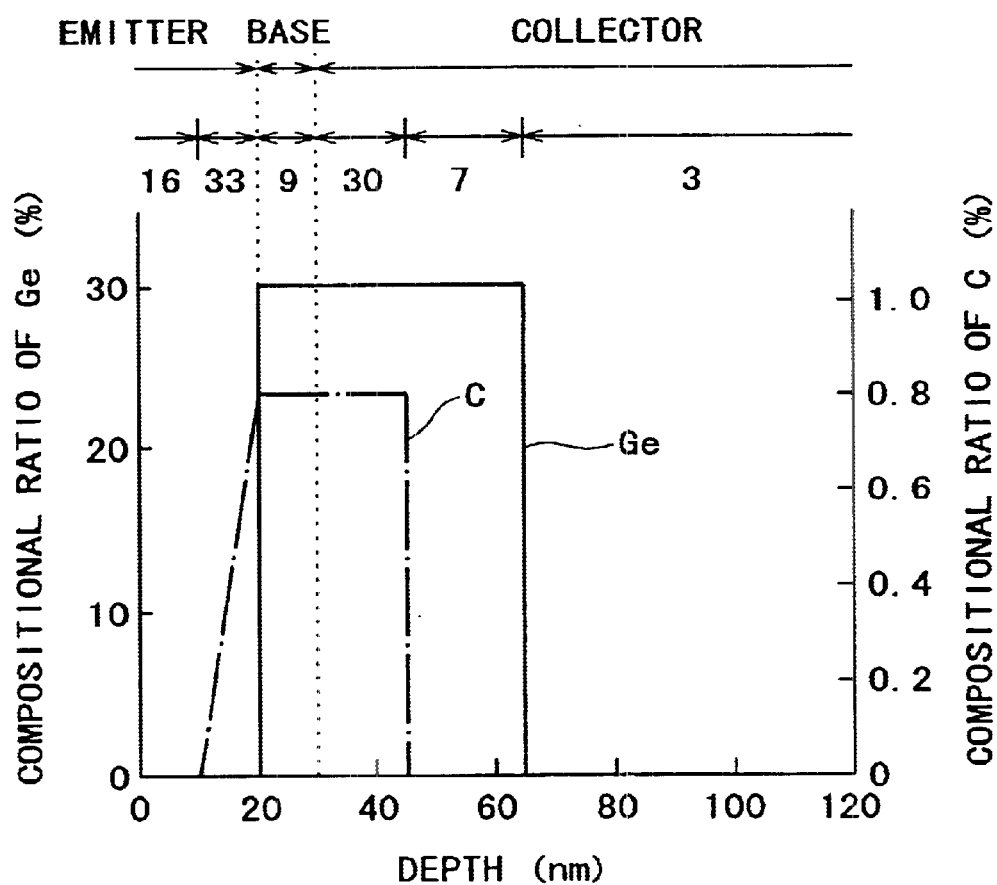
FIG. 21 is a diagram showing the profile of compositional ratio of Ge and C in the HBT pertaining to a twelfth preferred embodiment of the present invention.

FIG. 21 shows the profile of the compositional ratios of Ge and C in the HBT according to a twelfth preferred example of the present invention. The difference between Example 7 and Example 12 is that the compositional ratio of C increases in going from the emitter to the collector in at least part of the layer 33 of n-type single-crystal SiC as the emitter.

According to this example, the change in lattice strain is small at the interface between the layer 16 of single-crystal Si and the layer 33 of n-type single-crystal SiC layer (both forming the emitter). This makes it possible to reduce dislocations and defects due to strain and hence to suppress the generation of leakage current and dopant diffusion due to these dislocations and defects. This helps improve the yields of the HBTs and reduce fluctuations in characteristic properties. The same effect as mentioned above is obtained even though the collector is formed with a layer 34 of n-type single-crystal SiGeC.

EXAMPLE 13

Figure 22:
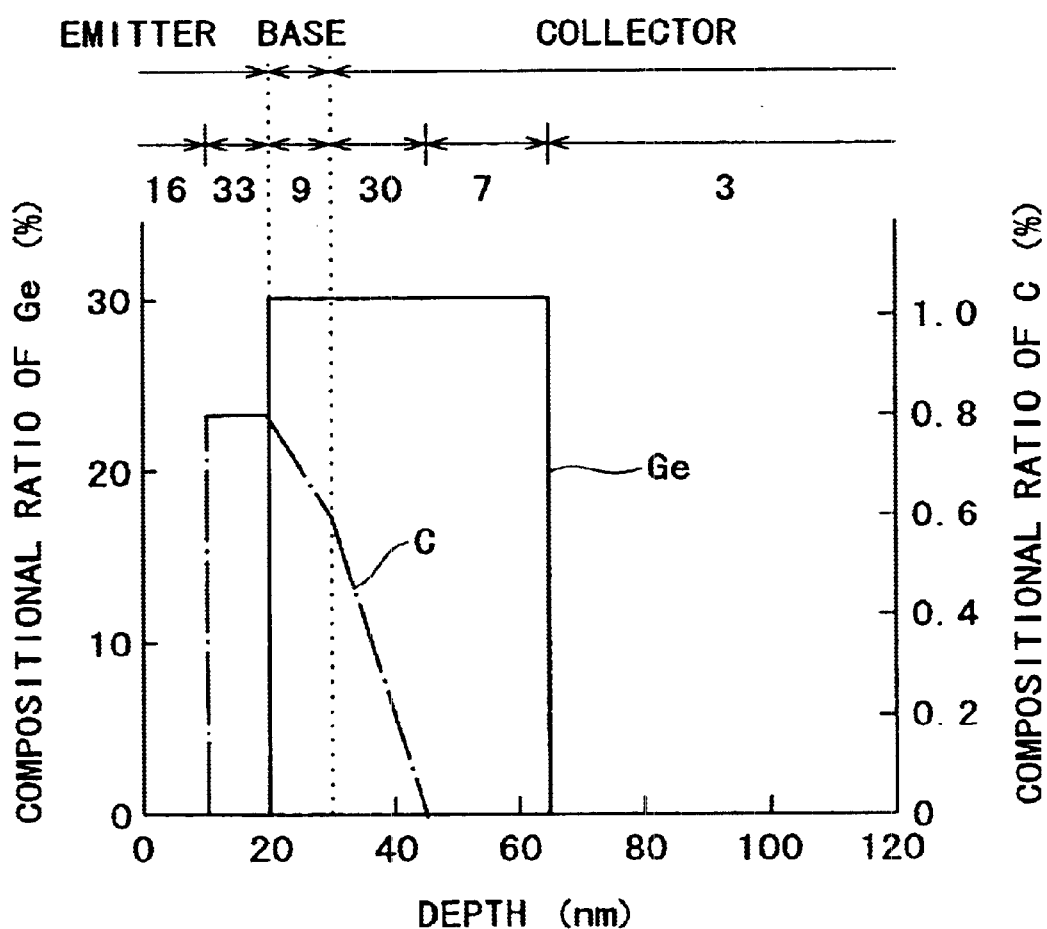
FIG. 22 is a diagram showing the profile of compositional ratio of Ge and C in the HBT pertaining to a thirteenth preferred embodiment of the present invention.

FIG. 22 shows the profiles of the compositional ratios of Ge and C in the HBT according to a thirteenth preferred example of the present invention. The difference between Example 7 and Example 13 is that the compositional ratio of C decreases in going from the emitter to the collector in at least part of the layer 9 of n-type single-crystal SiGeC as the base.

The HBT in this example operates faster than that in Example 7 because the inclined conduction band generates the drift electric field which accelerates electrons in the layer 9 of p-type single-crystal SiGeC. The HBT in this example has a smaller compositional ratio of C in the layer 9 of n-type single-crystal SiGeC than that in Example 7; therefore, it is not necessary to lower the growth temperature for improvement in crystallinity. The result is a great reduction in growth time for the layer 9 of n-type single-crystal SiGeC. This contributes to improved throughput in the production of SiGeC HBT. The same effect as mentioned above can be obtained even though the collector has a layer 30 of n-type single-crystal SiGeC.

EXAMPLE 14

Figure 23:
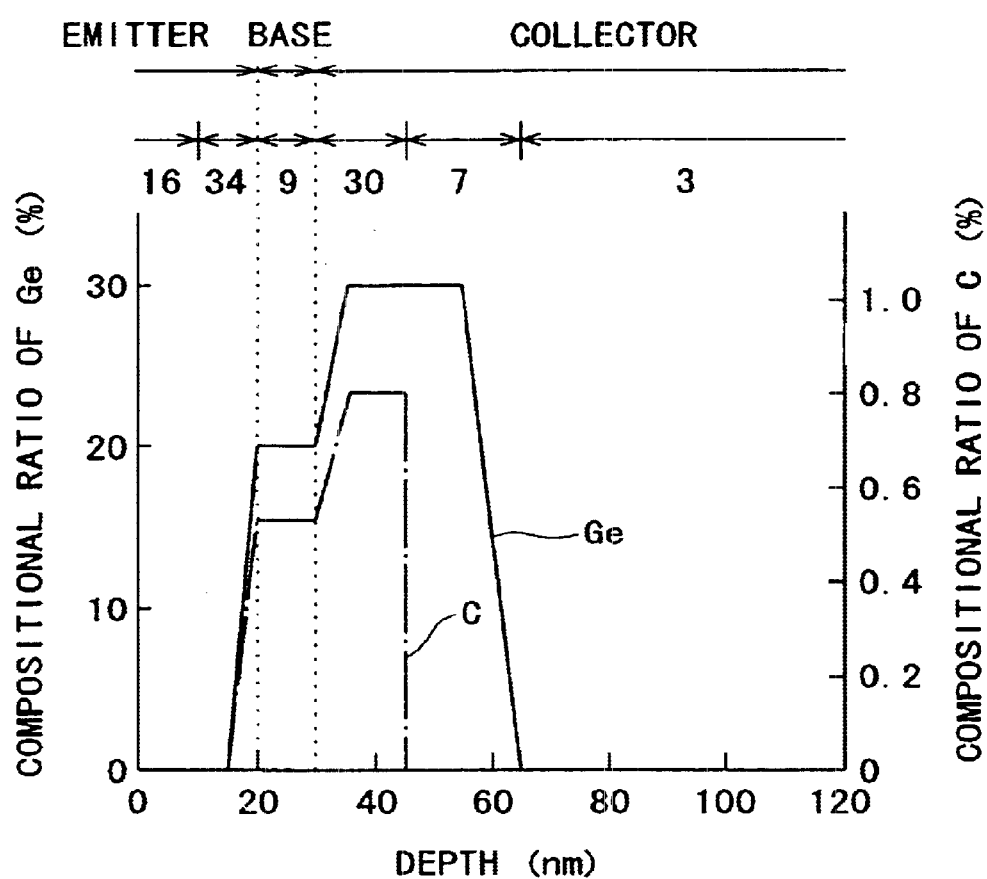
FIG. 23 is a diagram showing the profile of compositional ratio of Ge and C in the HBT pertaining to a fourteenth preferred embodiment of the present invention.
Figure 2:
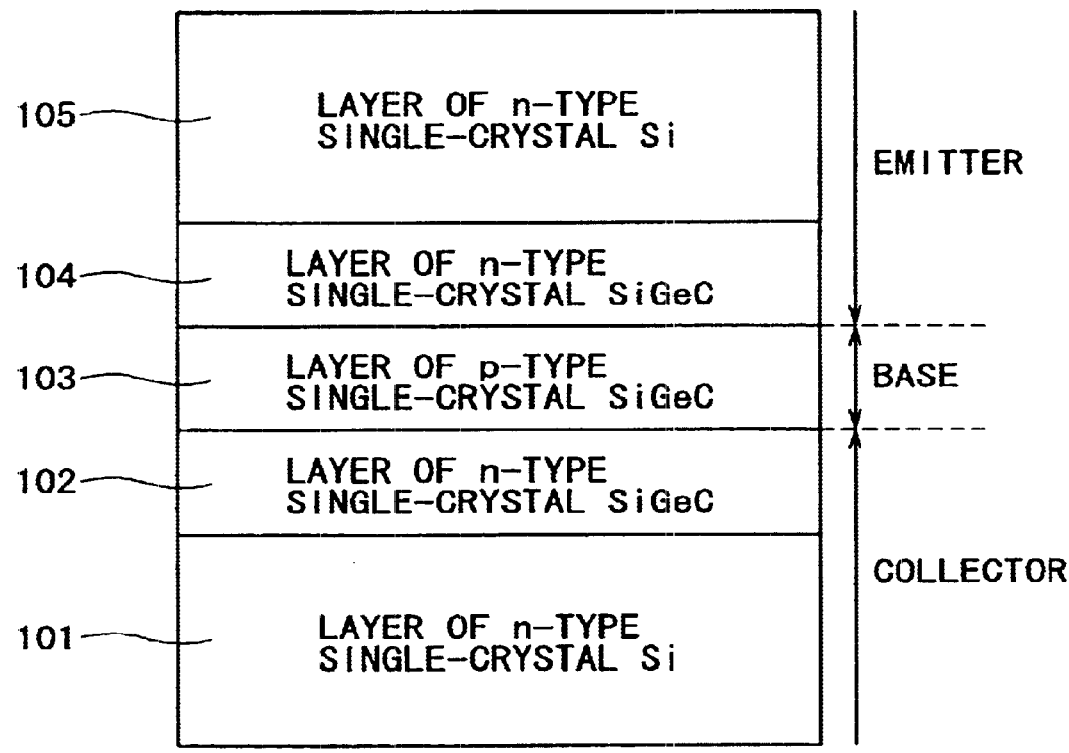
Figure 2:
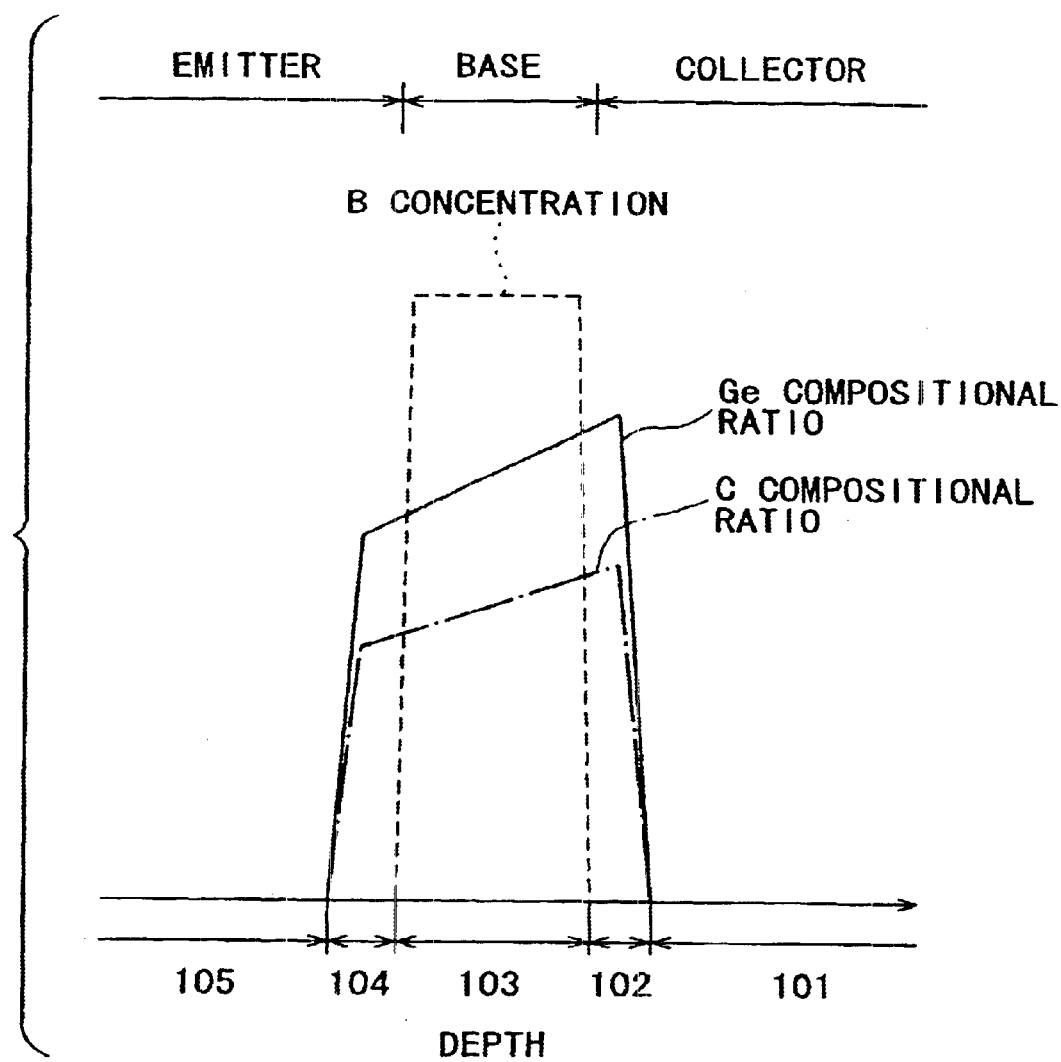
Figure 26A:
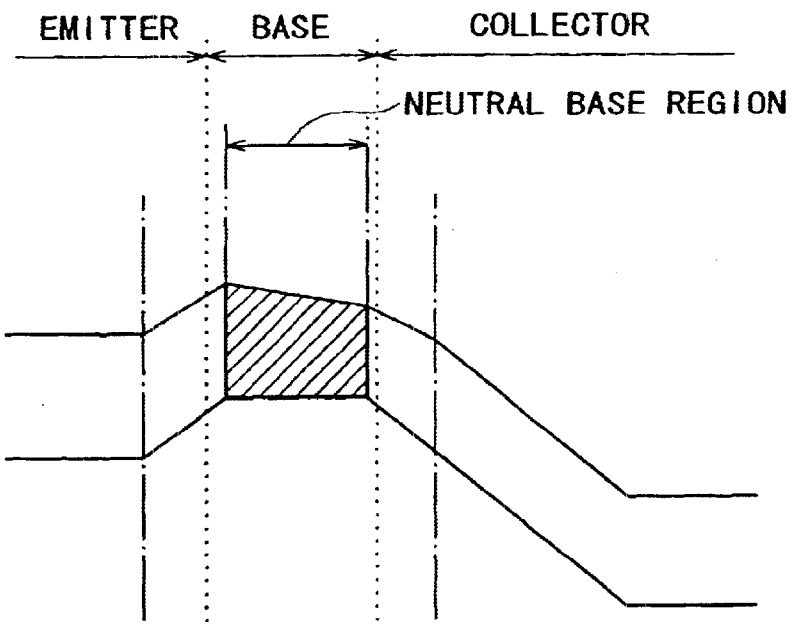
FIGS. 26A and 26B are diagrams showing the energy band structures, for small and large injection currents, respectively, of the conventional HBT which has the profile of impurity concentration as shown in FIG. 25.
Figure 26B:
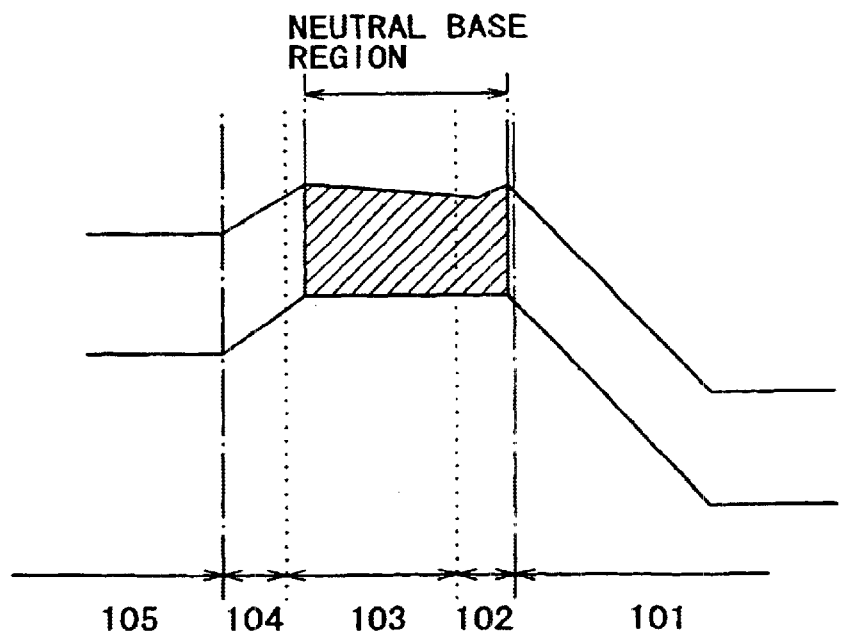
Figure 27:
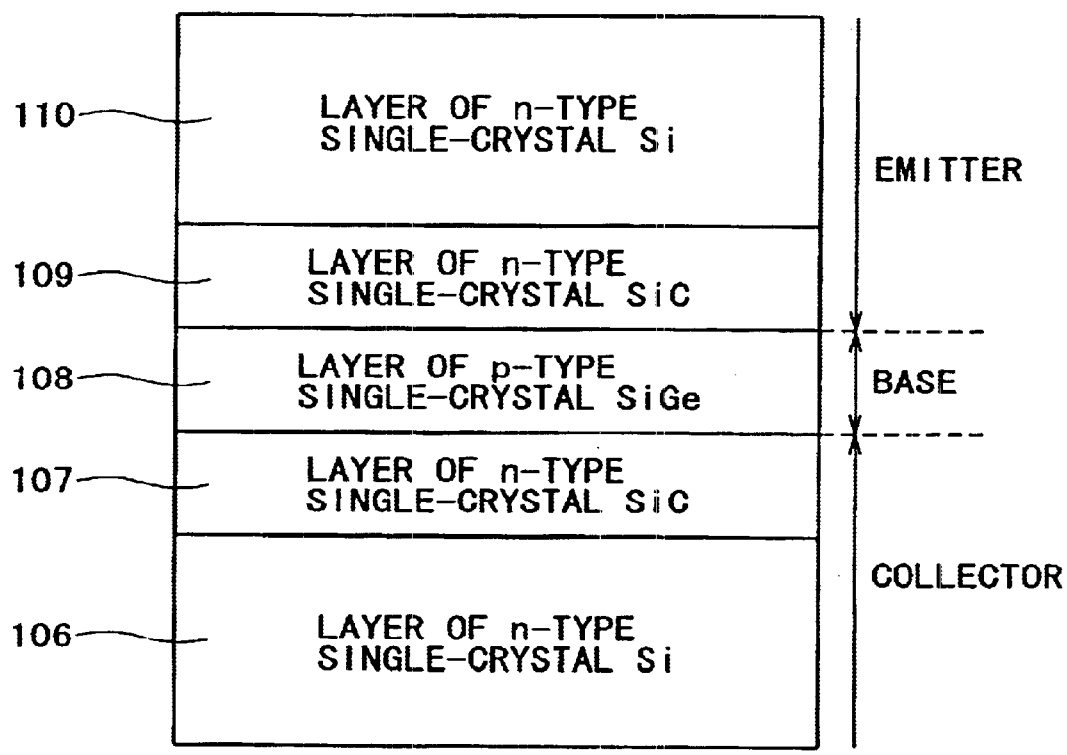
FIG. 27 is a sectional view showing the main region of another conventional HBT.

FIG. 23 shows the profile of the compositional ratios of Ge and C in the HBT according to a fourteenth preferred example of the present invention. The difference between Example 1 and Example 14 is that the compositional ratio of Ge changes in at least a part of the emitter, base, and collector such that the ratio of the compositional ratio of Ge to the compositional ratio of C ranges from 5 to 20. In this range of ratio, the layer 30 of single-crystal SiGeC which has been grown on the layer of single-crystal Si has a lattice constant close to that of Si. This contains less strain in the layer 7 of n-type single-crystal SiGe held between the layer 3 of n-type single-crystal Si and the layer 30 of n-type single-crystal SiGeC. The reduced strain suppresses the generation of dislocations and defects at the heterointerface between the layer 3 of n-type single-crystal Si and the layer 7 of n-type single-crystal SiGe at the time of annealing to form the emitter. This in turn suppresses leakage current and impurity diffusion due to these dislocations and defects. Thus it is possible to improve the yields and reliability of the HBTs.

In addition, according to this example, the surface roughness of the layer becomes smaller than 0.20 nm. This surface roughness is approximately equal to or smaller than that of the layer of single-crystal SiGe having the same compositional ratio of Ge. As the result, as compared with Example 2, the space is smaller between the layer 9 of heavily doped p-type single-crystal SiGeC and the extrinsic base layer 27, and hence the contract area is larger. This leads to a reduced base resistance and, therefore, a higher operating speed is obtained.

Because of the surface roughness smaller than 0.20 nm in this example, the layer 30 of n-type single-crystal SiGeC and the layer 9 of p-type single-crystal SiGeC have a uniform film thickness. This leads to reduced fluctuations in characteristic properties and improved the yields of the HBTs.

Needless to say, this example is applicable to any HBT in which at least part of the emitter, base, and collector contains the layer of single-crystal SiGeC and the same effect as mentioned above can be obtained.

<Summary of the Preferred Features of the Present Invention>

The HBT according to the present invention preferably has a layer of single-crystal SiGe which is interposed between the collector (a layer of n-type single-crystal Si) and the base (a layer of p-type single-crystal SiGeC) such that the bandgap of the layer of single-crystal SiGe is smaller than that of the layer of p-type single-crystal SiGeC at the heterointerface between the layer of single-crystal SiGe and the layer of p-type single-crystal SiGeC. This structure forms no energy barrier near the base even though electrons injected from the emitter increases and hence the diffusion of electrons is not suppressed. Consequently, the HBT keeps a high operating speed achievable even at its high injection of electrons from the emitter as well as when the injection of electrons from the emitter is low. In addition, the advantage of forming a layer of single-crystal SiGe in the collector over forming a layer of SiGeC of the same thickness is that time required to form the main region is reduced and this leads to reduction in production cost. Another advantage is that when the main region of the HBT is formed by selective epitaxial growth there is only a small possibility that a layer of polycrystalline semiconductor is formed on the isolation film. As the result, the base and emitter are less likely to short-circuit, and this leads to improved reliability. The compositional ratio of Ge to C in the layer of single-crystal SiGeC in the main region is in the range of 5 to 20. The result is that the surface roughness of the layer of single-crystal SiGeC decreases. This leads to an increased contact area between the extrinsic base layer and the layer of p-type single-crystal SiGeC (as the main base). This in turn leads to a decreased base resistance and an increased operating speed.

The following is a listing of the preferred embodiments of the present invention.

(1) An improved heterojunction bipolar transistor of the type having a collector comprising a layer of single-crystal Si of the first conductivity type and a layer of single-crystal SiGe of the first conductivity type formed thereon, a base comprising a layer of single-crystal SiGeC of the second conductivity type opposite to said first conductivity type formed on said layer of single-crystal SiGe of the first conductivity type, and an emitter comprising a layer of single-crystal Si of another first conductivity type formed on said layer of single-crystal SiGeC of the second conductivity type, wherein said improvement is characterized in that the bandgap of said layer of single-crystal SiGe of the first conductivity type, adjacent to the layer of single-crystal SiGeC of the second conductivity type, is approximately equal to or smaller than that of said layer of single-crystal SiGeC of the second conductivity type, adjacent to the layer of single-crystal SiGe of the first conductivity type.

(2) A heterojunction bipolar transistor as defined in (1) above, which is characterized in that an additional layer of single-crystal SiGeC of the first conductivity type (which becomes a part of the collector) is formed between said layer of single-crystal SiGe of the first conductivity type and said layer of single-crystal SiGeC of the second conductivity type and that the bandgap of said layer of single-crystal SiGeC of the first conductivity type, adjacent to the layer of single-crystal SiGe of the first conductivity type, is approximately equal to or larger than that of said layer of single-crystal SiGe of the first conductivity type, adjacent to the layer of single-crystal SiGeC of the first conductivity type-and the bandgap of said layer of single-crystal SiGeC of the first conductivity type, adjacent to the layer of single-crystal SiGeC of the second conductivity type, is approximately equal to or smaller than that of said layer of single-crystal SiGeC of the second conductivity type, adjacent to the layer of single-crystal SiGeC of the first conductivity type.

(3) An improved heterojunction bipolar transistor of the type having a collector comprising a layer of single-crystal Si of the first conductivity type and a layer of single-crystal SiGeC of the first conductivity type formed thereon, a base comprising a layer of single-crystal SiGe of the second conductivity type opposite to said first conductivity type formed on said layer of single-crystal SiGeC of the first conductivity type, and an emitter comprising a layer of single-crystal Si of another first conductivity type formed on said layer of single-crystal SiGe of the second conductivity type, wherein the bandgap of said layer of single-crystal SiGeC of the first conductivity type, adjacent to the layer of single-crystal SiGe of the second conductivity type, is approximately equal to or smaller than that of said layer of single-crystal SiGe of the second conductivity type, adjacent to the layer of single-crystal SiGeC of the first conductivity type.

(4) A heterojunction bipolar transistor as defined in (3) above having an additional layer of single-crystal SiGe of the first conductivity type (which becomes a part of the collector) formed between said layer of single-crystal Si of the first conductivity type and said layer of single-crystal SiGeC of the first conductivity type and that the bandgap of said layer of single-crystal SiGe of the first conductivity type, adjacent to the layer of single-crystal SiGeC of the first conductivity type, is approximately equal to or smaller than that of said layer of single-crystal SiGeC of the first conductivity type, adjacent to the layer of single-crystal SiGe of the first conductivity type.

(5) A heterojunction bipolar transistor as defined in (1) to (4) above having an additional layer of single-crystal SiGe of another first conductivity type (which becomes a part of the emitter) formed between said layer of single-crystal of the second conductivity type and said layer of single-crystal Si of another first conductivity type.

(6) A heterojunction bipolar transistor as defined in (5) above wherein the bandgap of the layer of single-crystal SiGe of another first conductivity type, adjacent to the layer of single-crystal of the second conductivity type, is approximately equal to or larger than that of said layer of single-crystal of the second conductivity type, adjacent to the layer of single-crystal SiGe of another first conductivity type.

(7) A heterojunction bipolar transistor as defined in (1) to (4) above having an additional layer of single-crystal SiC of another first conductivity type (which becomes a part of the emitter) formed between said layer of single-crystal of the second conductivity type and said layer of single-crystal Si of another first conductivity type.

(8) A heterojunction bipolar transistor as defined in (7) above wherein the bandgap of said layer of single-crystal SiC of another first conductivity type, adjacent to the layer of single-crystal of the second conductivity type, is approximately equal to or larger than that of said layer of single-crystal of the second conductivity type, adjacent to the layer of single-crystal SiC of another first conductivity type.

(9) A heterojunction bipolar transistor as defined in (1) to (4) above having an additional layer of single-crystal SiGeC of another first conductivity type (which becomes a part of the emitter) formed between said layer of single-crystal of the second conductivity type and said layer of single-crystal Si of another first conductivity type.

(10) A heterojunction bipolar transistor as defined in (9) above wherein the bandgap of said layer of single-crystal SiGeC of another first conductivity type, adjacent to the layer of single-crystal of the second conductivity type, is approximately equal to or larger than that of said layer of single-crystal of the second conductivity type, adjacent to the layer of single-crystal SiGeC of another first conductivity type.

(11) A heterojunction bipolar transistor as defined in (1) to (4) above having an additional layer of single-crystal SiGeC of another first conductivity type (which becomes a part of the emitter) formed between said layer of single-crystal of the second conductivity type and said layer of single-crystal Si of another first conductivity type and an additional layer of single-crystal SiC of the first conductivity type (which becomes a part of the emitter) is formed on said layer of single-crystal SiGeC of another first conductivity type.

(12) A heterojunction bipolar transistor as defined in (11) above wherein the bandgap of said layer of single-crystal SiGeC of another first conductivity type, adjacent to the layer of single-crystal of the second conductivity type, is approximately equal to or larger than that of said layer of single-crystal of the second conductivity type, adjacent to the layer of single-crystal SiGeC of another first conductivity type.

(13) A heterojunction bipolar transistor as defined in (11) or (12) above wherein the bandgap of the layer of single-crystal SiC of the first conductivity type, adjacent to the layer of single-crystal SiGeC of another first conductivity type, is approximately equal to or larger than that of said layer of single-crystal SiGeC of another first conductivity type, adjacent to the layer of single-crystal SiC of the first conductivity type.

(14) A heterojunction bipolar transistor as defined in (1) to (13) above wherein the compositional ratio of Ge increases in going from the emitter to the collector in at least part of the base and collector.

(15) A heterojunction bipolar transistor as defined in (5) or (6) above wherein there is a region in which the compositional ratio of Ge increases in going from the emitter to the collector in at least part of said layer of single-crystal SiGe of another first conductivity type.

(16) A heterojunction bipolar transistor as defined in (9) to (13) above wherein there is a region in which the compositional ratio of Ge increases in going from the emitter to the collector in at least part of said layer of single-crystal SiGeC of another first conductivity type.

(17) A heterojunction bipolar transistor as defined in (1) to (16) above wherein there is a region in which the compositional ratio of Ge decreases in going from the emitter to the collector in at least part of the collector.

(18) A heterojunction bipolar transistor wherein there is a region in which the compositional ratio of C increases in going from the emitter to the collector in at least part of the emitter.

(19) A heterojunction bipolar transistor as defined in (1) to (18) above wherein there is a region in which the compositional ratio of C increases in going from the emitter to the collector in at least part of the base and collector.

(20) A heterojunction bipolar transistor as defined in (1) to (19) above wherein the ratio of the compositional ratio of Ge to the compositional ratio of C is in the range of 5 to 20 in the layer of single-crystal containing both Ge and C.

(21) A heterojunction bipolar transistor as defined in (1) and (2) and (5) to (20) above which has an isolation film with an opening which is formed on a single-crystal substrate, a layer of single-crystal SiGe of the first conductivity type (which becomes the collector) which is formed in said opening of said isolation film, a layer of single-crystal SiGeC of the second conductivity type which is formed on said layer of single-crystal SiGe of the first conductivity type, and a layer of single-crystal Si of another first conductivity type which is formed on said layer of single-crystal SiGeC of the second conductivity type.

(22) A method for production of a heterojunction bipolar transistor which comprises a step of forming an isolation film on a single-crystal substrate, a step of making an opening in said isolation film, a step of forming by selective epitaxial growth in only said opening a layer of single-crystal SiGe of the first conductivity type which becomes the collector, and a step of forming by selective epitaxial growth in only said opening a layer of single-crystal SiGeC of the second conductivity type on said layer of single-crystal SiGe of the first conductivity type.

(23) A heterojunction bipolar transistor as defined in (3) to (20) above which has an isolation film with an opening which is formed on a single-crystal substrate, a layer of single-crystal SiGeC of the first conductivity type (which becomes the collector) which is formed in said opening of said isolation film, a layer of single-crystal SiGe of the second conductivity type which is formed on said layer of single-crystal SiGeC of the first conductivity type, and a layer of single-crystal Si of another first conductivity type which is formed on said layer of single-crystal SiGe of the second conductivity type.

(24) A method for production of a heterojunction bipolar transistor which comprises a step of forming an isolation film on a single-crystal substrate, a step of making an opening in said isolation film, a step of forming by selective epitaxial growth in only said opening a layer of single-crystal SiGeC of the first conductivity type which becomes the collector, and a step of forming by selective epitaxial growth in only said opening a layer of single-crystal SiGe of the second conductivity type on said layer of single-crystal SiGeC of the first conductivity type.

As described in detail above, according to the present invention, when a layer of n-type single-crystal SiGe of the collector is formed between a layer of n-type single-crystal Si of the collector and a layer of p-type single-crystal SiGeC of the base, the bandgap of the layer of n-type single-crystal SiGe is made lower than that of the layer of p-type single-crystal SiGeC at the heterointerface between the n-type single-crystal SiGe layer and the p-type single-crystal SiGeC layer, thereby no energy barrier is formed at the position near the base even in the case where the electrons injected from the emitter increases and hence the diffusion of electrons is not blocked. Because of this, it is possible to maintain the high operating speed of HBT in the same way as when the injection of electrons from the emitter is low even though the injection of electrons from the emitter is large.

Also, by forming the single-crystal SiGe layer in the collector, the forming time of the main region of the HBT is reduced as compared with the case in which the SiGeC layer having approximately the same film thickness is formed, and it is possible to reduce the production cost of HBT.

In addition, when forming the main region of HBT by using selective epitaxial growth, the polycrystalline semiconductor layer is formed less easily on the isolation film. As the result, the occurrence of short-circuits in the base, emitter, etc. becomes less, and the reliability of HBT improves. By making the compositional ratio of Ge to C in the single-crystal SiGe layer formed in the main region in the range of 5 to 20 and interlinking the compositional ratio of Ge and C, the surface roughness of the single-crystal SiGeC becomes small, and hence the contact area of the extrinsic base layer and the p-type SiGeC layer of the intrinsic base region increases and the base resistance decreases. Because of this, it is possible to increase the operating speed of HBT.

The foregoing invention has been described in terms of preferred embodiments. However, those skilled, in the art will recognize that many variations of such embodiments exist. Such variations are intended to be within the scope of the present invention and the appended claims.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A heterojunction bipolar transistor comprising:
    a collector comprising a layer of single-crystal Si of the first conductivity type and a layer of single-crystal SiGe of the first conductivity type formed thereon;
    a base comprising a layer of single-crystal SiGeC of the second conductivity type opposite to said first conductivity type formed on said layer of single-crystal SiGe of the first conductivity type; and
    an emitter comprising a layer of single-crystal Si of another first conductivity type formed on said layer of single-crystal SiGeC of the second conductivity type, wherein
    the bandgap of said layer of single-crystal SiGe of the first conductivity type, adjacent to the layer of single-crystal SiGeC of the second conductivity type, is approximately equal to or smaller than that of said layer of single-crystal SiGeC of the second conductivity type, adjacent to the layer of single-crystal SiGe of the first conductivity type.

2. The heterojunction bipolar transistor of claim 1 further comprising an additional layer of single-crystal SiGeC of the first conductivity type formed as part of the collector between said layer of single-crystal SiGe of the first conductivity type and said layer of single-crystal SiGeC of the second conductivity type, wherein
    the bandgap of said layer of single-crystal SiGeC of the first conductivity type, adjacent to the layer of single-crystal SiGe of the first conductivity type, is approximately equal to or larger than that of said layer of single-crystal SiGe of the first conductivity type, adjacent to the layer of single-crystal SiGeC of the first conductivity type and
    the bandgap of said layer of single-crystal SiGeC of the first conductivity type, adjacent to the layer of single-crystal SiGeC of the second conductivity type, is approximately equal to or smaller than that of said layer of single-crystal SiGeC of the second conductivity type, adjacent to the layer of single-crystal SiGeC of the first conductivity type.

3. A heterojunction bipolar transistor comprising:
    a collector comprising a layer of single-crystal Si of the first conductivity type and a layer of single-crystal SiGeC of the first conductivity type formed thereon;
    a base comprising a layer of single-crystal SiGe of the second conductivity type opposite to said first conductivity type formed on said layer of single-crystal SiGeC of the first conductivity type; and
    a emitter comprising a layer of single-crystal Si of another first conductivity type is formed on said layer of single-crystal SiGe of the second conductivity type,
    wherein the bandgap of said layer of single-crystal SiGeC of the first conductivity type, adjacent to the layer of single-crystal SiGe of the second conductivity type, is approximately equal to or smaller than that of said layer of single-crystal SiGe of the second conductivity type, adjacent to the layer of single-crystal SiGeC of the first conductivity type.

4. The heterojunction bipolar transistor of claim 3 further comprising an additional layer of single-crystal SiGe of the first conductivity type formed as part of the collector between said layer of single-crystal Si of the first conductivity type and said layer of single-crystal SiGeC of the first conductivity type, wherein
    the bandgap of said layer of single-crystal SiGe of the first conductivity type, adjacent to the layer of single-crystal SiGeC of the first conductivity type, is approximately equal to or smaller than that of said layer of single-crystal SiGeC of the first conductivity type, adjacent to the layer of single-crystal SiGe of the first conductivity type.

5. The heterojunction bipolar transistor defined in claim 1 further comprising an additional layer of single-crystal SiGe of another first conductivity type formed as part of the emitter between said layer of single-crystal of the second conductivity type and said layer of single-crystal Si of another first conductivity type.

6. The heterojunction bipolar transistor of claim 5 wherein the bandgap of the layer of single-crystal SiGe of another first conductivity type, adjacent to the layer of single-crystal of the second conductivity type, is approximately equal to or larger than that of said layer of single-crystal of the second conductivity type, adjacent to the layer of single-crystal SiGe of another first conductivity type.

7. The heterojunction bipolar transistor defined in claim 1 further comprising an additional layer of single-crystal SiC of another first conductivity type formed as part of the emitter between said layer of single-crystal of the second conductivity type and said layer of single-crystal Si of another first conductivity type.

8. The heterojunction bipolar transistor of claim 7 wherein the bandgap of said layer of single-crystal SiC of another first conductivity type, adjacent to the layer of single-crystal of the second conductivity type, is approximately equal to or larger than that of said layer of single-crystal of the second conductivity type, adjacent to the layer of single-crystal SiC of another first conductivity type.

9. The heterojunction bipolar transistor defined in claim 1 further comprising an additional layer of single-crystal SiGeC of another first conductivity type formed as part of the emitter between said layer of single-crystal of the second conductivity type and said layer of single-crystal Si of another first conductivity type.

10. The heterojunction bipolar transistor of claim 9 wherein the bandgap of said layer of single-crystal SiGeC of another first conductivity type, adjacent to the layer of single-crystal of the second conductivity type, is approximately equal to or larger than that of said layer of single-crystal of the second conductivity type, adjacent to the layer of single-crystal SiGeC of another first conductivity type.

11. The heterojunction bipolar transistor defined in claim 1 further comprising an additional layer of single-crystal SiGeC of another first conductivity type formed as part of the emitter between said layer of single-crystal of the second conductivity type and said layer of single-crystal Si of another first conductivity type and an additional layer of single-crystal SiC of another first conductivity type formed as part of the emitter on said layer of single-crystal SiGeC of another first conductivity type.

12. The heterojunction bipolar transistor of claim 11 wherein the bandgap of said layer of single-crystal SiGeC of another first conductivity type, adjacent to the layer of single-crystal of the second conductivity type, is approximately equal to or larger than that of said layer of single-crystal of the second conductivity type, adjacent to the layer of single-crystal SiGeC of another first conductivity type.

13. The heterojunction bipolar transistor of claim 11 wherein the bandgap of the layer of single-crystal SiC of another first conductivity type, adjacent to the layer of single-crystal SiGeC of another first conductivity type, is approximately equal to or larger than that of said layer of single-crystal SiGeC of another first conductivity type, adjacent to the layer of single-crystal SiC of another first conductivity type.

14. The heterojunction bipolar transistor defined in claim 1 wherein the compositional ratio of Germanium (Ge) increases in going from the emitter to the collector in at least part of the base and collector.

15. The heterojunction bipolar transistor of claim 5 wherein there is a region in which the compositional ratio of Germanium (Ge) increases in going from the emitter to the collector in at least part of said layer of single-crystal SiGe of another first conductivity type.

16. The heterojunction bipolar transistor defined in claim 9 wherein there is a region in which the compositional ratio of Germanium (Ge) increases in going from the emitter to the collector in at least part of said layer of single-crystal SiGeC of another first conductivity type.

17. The heterojunction bipolar transistor defined in claim 1 wherein the compositional ratio of Germanium (Ge) decreases in going from the emitter to the collector in at least part of the collector.

* * * * *